(12) United States Patent  
Tajiri et al.

(10) Patent No.: US 9,405,422 B2
(45) Date of Patent: Aug. 2, 2016

(54) CONDUCTIVE SHEET, MANUFACTURING METHOD OF CONDUCTIVE SHEET, AND TOUCH PANEL

(71) Applicant: FUJIFILM Corporation, Tokyo (JP)

(72) Inventors: Shin Tajiri, Kanagawa (JP); Kensuke Katagiri, Kanagawa (JP); Toshinari Fujii, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/863,534

(22) Filed: Sep. 24, 2015

(65) Prior Publication Data

US 2016/0011698 A1    Jan. 14, 2016

Related U.S. Application Data

(63) Continuation of application No. PCT/JP2014/057318, filed on Mar. 18, 2014.

(30) Foreign Application Priority Data

Mar. 27, 2013    (JP) .................................. 2013-067512

(51) Int. Cl.
  *G06F 3/044*    (2006.01)
  *G03C 1/91*    (2006.01)
  (Continued)

(52) U.S. Cl.
  CPC   *G06F 3/044* (2013.01); *G03C 1/91* (2013.01); *G03F 7/20* (2013.01); *G03F 7/32* (2013.01); *G03F 7/40* (2013.01); *G06F 3/041* (2013.01); *G06F 2203/04103* (2013.01)

(58) Field of Classification Search
  CPC ............... G03C 1/91; G03F 7/20; G03F 7/32; G03F 7/40; G03F 2203/04103; G03F 3/041; G03F 3/044

USPC .......... 345/173, 174; 430/9, 325; 29/847, 850
See application file for complete search history.

(56) References Cited

U.S. PATENT DOCUMENTS

| | | | | |
|---|---|---|---|---|
| 8,884,918 | B2 * | 11/2014 | Cok | ........................ G06F 3/044 345/173 |
| 2011/0134655 | A1 * | 6/2011 | Ohtani | ..................... H05B 3/84 362/546 |

(Continued)

FOREIGN PATENT DOCUMENTS

| JP | 2007-12404 A | 1/2007 |
|---|---|---|
| JP | 2008-288305 A | 11/2008 |

(Continued)

OTHER PUBLICATIONS

International Search Report for PCT/JP2014/057318 dated Jun. 10, 2014 [PCT/ISA/210], 5 pages in Japanese and English.

(Continued)

*Primary Examiner* — Dmitriy Bolotin
(74) *Attorney, Agent, or Firm* — Sughrue Mion, PLLC

(57) ABSTRACT

The conductive sheet includes a support and a conductive portion which is disposed on the support and composed of thin conductive wires containing metal silver and gelatin, in which gelatin is substantially not contained between the thin conductive wires on the support, and a volume ratio (A/B) of a volume A of the metal silver to a volume B of the gelatin in the thin conductive wires is 0.3 to 10.0. In the conductive sheet, the occurrence of ion migration between thin conductive wires is further inhibited. A manufacturing method of the conductive sheet and a touch panel including the conductive sheet are also provided.

19 Claims, 2 Drawing Sheets

(51) Int. Cl.
*G06F 3/041* (2006.01)
*G03F 7/20* (2006.01)
*G03F 7/32* (2006.01)
*G03F 7/40* (2006.01)

(56) References Cited

U.S. PATENT DOCUMENTS

| | | | | | |
|---|---|---|---|---|---|
| 2011/0289771 | A1* | 12/2011 | Kuriki | | H05K 3/064 29/829 |
| 2011/0290631 | A1* | 12/2011 | Kuriki | | G06F 3/044 200/600 |
| 2011/0308846 | A1* | 12/2011 | Ichiki | | G06F 3/044 174/257 |
| 2012/0285726 | A1* | 11/2012 | Tokunaga | | G03C 1/85 174/126.2 |
| 2012/0312677 | A1* | 12/2012 | Kuriki | | G06F 3/044 200/600 |
| 2013/0219679 | A1* | 8/2013 | Cok | | H01G 13/00 29/25.41 |
| 2013/0222325 | A1* | 8/2013 | Cok | | G06F 3/044 345/174 |
| 2013/0222326 | A1* | 8/2013 | Cok | | G06F 3/044 345/174 |
| 2013/0222327 | A1* | 8/2013 | Cok | | G06F 3/044 345/174 |
| 2013/0222328 | A1* | 8/2013 | Cok | | G06F 3/044 345/174 |
| 2013/0224370 | A1* | 8/2013 | Cok | | C23C 18/06 427/108 |
| 2013/0278544 | A1* | 10/2013 | Cok | | G06F 3/044 345/174 |
| 2013/0278545 | A1* | 10/2013 | Cok | | G06F 3/044 345/174 |
| 2013/0299216 | A1* | 11/2013 | Ichiki | | G06F 3/044 174/255 |
| 2014/0063374 | A1* | 3/2014 | Kuriki | | G06F 3/044 349/12 |
| 2014/0098307 | A1 | 4/2014 | Iwami | | |

FOREIGN PATENT DOCUMENTS

| | | |
|---|---|---|
| JP | 2011-159492 A | 8/2011 |
| JP | 4895536 B2 | 3/2012 |
| JP | 2013-20785 A | 1/2013 |

OTHER PUBLICATIONS

Written Opinion for PCT/JP2014/057318 dated Jun. 10, 2014 [PCT/ISA/237], 5 pages in Japanese and English.
International Preliminary Report on Patentability and Written Opinion, issued Sep. 29, 2015, in corresponding International Application No. PCT/JP2014/057318, 4 pages in English.

* cited by examiner

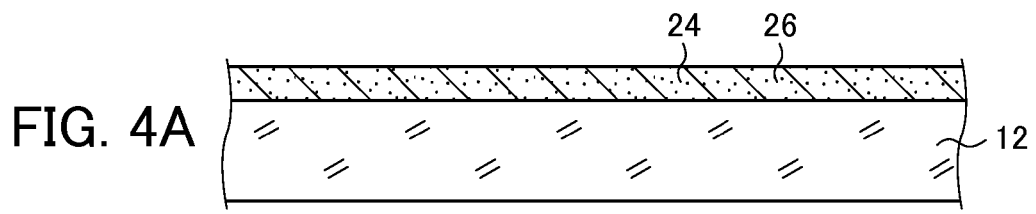
FIG. 4A
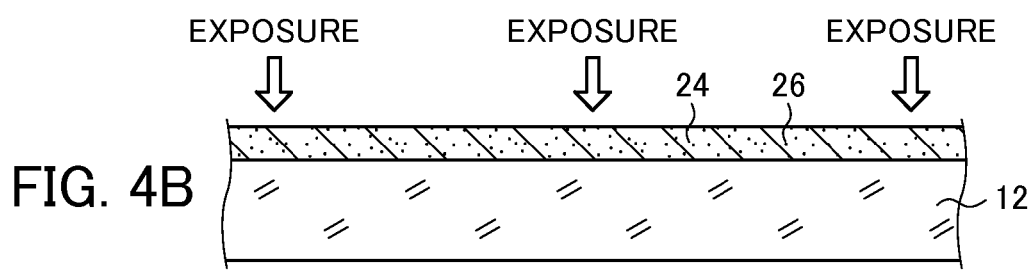
FIG. 4B
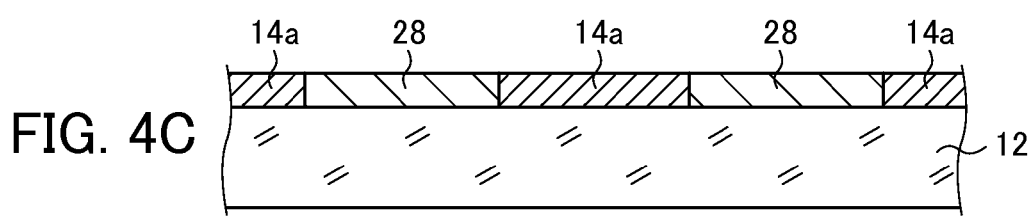
FIG. 4C
FIG. 5
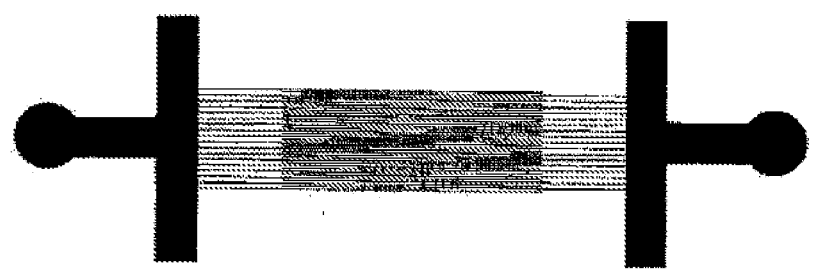

CONDUCTIVE SHEET, MANUFACTURING METHOD OF CONDUCTIVE SHEET, AND TOUCH PANEL

CROSS-REFERENCE TO RELATED APPLICATIONS

This application is a Continuation of PCT International Application No. PCT/JP2014/057318 filed on Mar. 18, 2014, which claims priority under 35 U.S.C. §119(a) to Japanese Patent Application No. 2013-067512 filed on Mar. 27, 2013. The above application is hereby expressly incorporated by reference, in its entirety, into the present application.

BACKGROUND OF THE INVENTION

The present invention relates to a conductive sheet, particularly, to a conductive sheet having a conductive portion in which a volume ratio of metal silver to gelatin is within a predetermined range.

Furthermore, the present invention relates to a manufacturing method of the conductive sheet and a touch panel including the conductive sheet.

A conductive sheet, in which thin conductive wires have been formed on a support, is widely used in a transparent electrode of various electronic devices such as a solar cell, an inorganic EL element, and an organic EL element, an electromagnetic wave shield of various display apparatuses, a touch panel, a transparent sheet-type heating element, and the like. Particularly, in recent years, as a touch panel has been more frequently mounted on cellular phones or mobile game consoles, a demand for a conductive sheet for capacitance type touch panels that can perform multipoint detection has rapidly increased.

As a method for forming such a conductive sheet, a method for forming thin conductive wires with low resistance from a silver image, which is obtained by developing a silver halide photographic sensitive material, is under examination. For example, JP 4895536 B suggests, as a method for obtaining a transparent conductive material having high transparency and conductivity with excellent productivity, a method of decomposing gelatin by treating the gelatin with an enzyme-containing treatment solution which contains an enzyme acting on gelatin.

The silver-containing thin conductive wires manufactured from the silver halide photographic sensitive material have a problem in that ion migration easily occurs. When the ion migration occurs between the thin conductive wires, the thin conductive wires become conductive to each other, and thus the wires cannot function as a circuit.

Particularly, in recent years, as the products have been required to be further miniaturized and to demonstrate higher performance, the wiring interval has been further narrowed, and therefore the conduction of a circuit has more easily occurred due to ion migration. For example, in the field of touch panels, a busbar and lead-out wirings are desired to be formed such that they are positioned within a very narrow frame range at the edge of a panel. Consequentially, in this situation, the space between wirings in a peripheral wiring portion is reduced, and thus conduction easily occurs due to ion migration.

In contrast, when the wiring interval is narrowed as described above, the conductive sheet manufactured by the method described in JP 4895536 B does not always exhibit a sufficient effect with respect to ion migration, and thus, the ion migration inhibition effect of the conductive sheet needs to be further improved.

SUMMARY OF THE INVENTION

The present invention has been made under the circumstances described above, and an object thereof is to provide a conductive sheet, in which the occurrence of ion migration between thin conductive wires is further inhibited, and a manufacturing method of the conductive sheet.

Another object of the present invention is to provide a touch panel including the aforementioned conductive sheet.

In order to achieve the aforementioned objects, the inventors of the present invention conducted intensive examination. As a result, they found that by controlling the amount of gelatin highly correlated with the occurrence of ion migration, intended effects can be obtained.

That is, the present inventors found that the aforementioned objects can be achieved by the following constitution.

(1) A conductive sheet including: a support; and a conductive portion which is disposed on the support and composed of thin conductive wires containing metal silver and gelatin, wherein gelatin is substantially not contained between the thin conductive wires on the support, and a volume ratio (A/B) of a volume A of the metal silver to a volume B of the gelatin in the thin conductive wires is 0.3 to 10.0.

(2) The conductive sheet according to (1), wherein the conductive sheet has a binder portion, which contains a polymer different from gelatin and substantially does not contain gelatin, between the thin conductive wires on the support.

(3) The conductive sheet according to (1) or (2), wherein the volume ratio (A/B) is 0.3 to 2.0.

(4) A manufacturing method of the conductive sheet according to any one of (1) to (3), including: a step A of forming a silver halide-containing photosensitive layer, which contains silver halide, gelatin, and a polymer different from gelatin and in which a mass ratio (Y/X) of a mass Y of the polymer to a mass X of the gelatin is equal to or greater than 0.1, on a support; a step B of forming a conductive portion composed of thin conductive wires, which contain metal silver and gelatin, by performing exposure and then development treatment on the silver halide-containing photosensitive layer; a step C of performing heating treatment on the support having the conductive portion obtained by the step B; and a step D of treating the support having the conductive portion with a protease which decomposes the gelatin.

(5) The manufacturing method according to (4), wherein the support has an undercoat layer, which contains the polymer different from gelatin, on the surface of the support.

(6) The manufacturing method according to (4) or (5), further including: a step of forming a gelatin-containing protective layer on the silver halide-containing photosensitive layer between the step A and the step B.

(7) The manufacturing method according to any one of (4) to (6), further including: a step of performing smoothing treatment on the conductive portion between the step B and the step D and/or after the step D.

(8) The manufacturing method according to (7), wherein the smoothing treatment is calendar treatment in which the support having the conductive portion is passed between one or more pairs of rolls under a pressure condition of 2 MPa to 120 MPa.

(9) The manufacturing method according to any one of (4) to (8), further including: a step of crosslinking the polymer different from gelatin between the step B and the step D and/or after the step D.
(10) The manufacturing method according to any one of (4) to (9), further including: a step of irradiating the conductive portion with pulsed light from a xenon flash lamp between the step B and the step D and/or after the step D.
(11) The manufacturing method according to (10), wherein irradiation of the pulsed light from the xenon flash lamp is performed under conditions in which an irradiation energy per pulse is equal to or less than 1,500 J, and a number of times the pulsed light is radiated is equal to or less than 2,000.
(12) A touch panel including: the conductive sheet according to any one of (1) to (3) or the conductive sheet manufactured by the manufacturing method according to any one of (4) to (11); and a transparent adhesive layer disposed on the conductive portion of the conductive sheet, wherein an acid value of an adhesive contained in the transparent adhesive layer is equal to or less than 100 mg KOH/g, and a water absorption rate of the adhesive is equal to or less than 1.0%.

According to the present invention, it is possible to provide a conductive sheet, in which the occurrence of ion migration between thin conductive wires is further inhibited, and a manufacturing method of the conductive sheet.

Furthermore, according to the present invention, it is possible to provide a touch panel including the aforementioned conductive sheet.

BRIEF DESCRIPTION OF THE DRAWINGS

FIGS. 4A to 4C are views showing steps of a manufacturing method of an embodiment of the conductive sheet of the present invention.

FIG. 5 is a schematic view showing a comb-type pattern electrode used in tests in the section of examples.

DETAILED DESCRIPTION OF THE INVENTION

Figure 1:
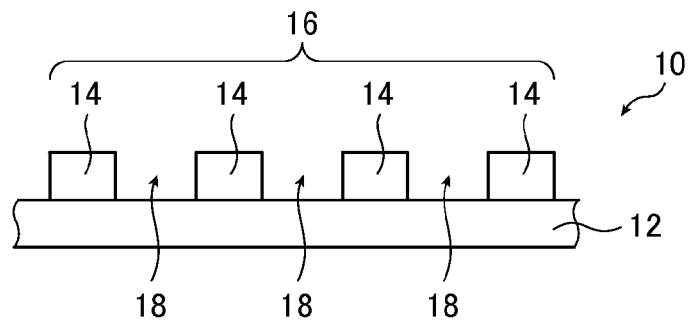
FIG. 1 is a cross-sectional view of an embodiment of a conductive sheet of the present invention.

Hereinafter, preferred embodiments of the conductive sheet of the present invention and preferred embodiments of the manufacturing method of the conductive sheet of the present invention will be described.

First, characteristics of the present invention will be specifically described in comparison with the conventional art.

In the present invention, it was found that by controlling a volume ratio of metal silver to gelatin in thin conductive wires disposed on a support to be within a predetermined range and by substantially removing gelatin between the thin conductive wires, it is possible to manufacture a conductive sheet in which the occurrence of ion migration is further inhibited. Generally, gelatin is hydrophilic and thus easily absorbs moisture in the air. Presumably, for this reason, ionization of the metal silver may easily proceed. Therefore, first, by controlling a volume ratio (A/B) of a volume A of metal silver to a volume B of gelatin in the thin conductive wires to be equal to or greater than 0.3 such that the amount of the gelatin is reduced relative to the amount of the metal silver, the occurrence of ion migration is inhibited. The volume ratio (A/B) is preferably equal to or less than 10.0. Although the reason for that has not been clarified in detail, presumably, if a predetermined amount of gelatin remains, silver ions eluted from the metal silver may be trapped, and therefore the migration of the silver ions may be inhibited. In addition, since the gelatin is substantially not contained between the thin conductive wires, the migration of silver ions between the thin conductive wires is further inhibited.

As a preferred manufacturing method of the conductive sheet, a silver halide-containing photosensitive layer, which contains gelatin and a polymer different from gelatin, is formed, and the formed layer is subjected to exposure and development, and then subjected to heating treatment. By performing the heating treatment, the polymers different from gelatin are fused to each other. As a result, at the time of performing treatment with a protease after the heating treatment, the shape of the conductive portion can be maintained even after the gelatin is decomposed and removed, and the ion migration is inhibited by the removal of gelatin.

Regarding touch panel modules, a cost reduction is highly required, and in a case in which the cost reduction is achieved by simplifying the module structure, it is desirable to improve the durability of the conductive sheet. Generally, a touch panel module is used in a state in which a hard coat film is pasted to a liquid crystal display (LCD) via an optical adhesive layer. However, if the durability of the conductive sheet can be improved, the conductive sheet may be coated with the hard coat layer so as to simplify the module structure, or alternatively, an FPC and the conductive sheet may be integrated so as to reduce the number of module members and the number of steps. These methods can make a contribution to the cost reduction of the touch panel modules.

Furthermore, the module is also highly required to be made into a thinner film module, a three-dimensional molding-type module, and the like. However, in many cases, due to the durability, the usable members are limited for the requirement. By improving the durability of the conductive sheet, the restriction on the members to be combined with each other is reduced, and consequently, the development to a thinner film module and a three-dimensional molding-type module becomes possible.

Having excellent durability, the conductive sheet of the present invention can make a contribution to the cost reduction described above and can be developed to various purposes. In the present specification, as an example of evaluating the durability of the conductive sheet, a peel strength of the conductive sheet with respect to a transparent adhesive layer is measured in the section of the examples which will be described later. If the conductive sheet has a high peel strength, this means that the conductive sheet is not easily peeled off from the transparent adhesive layer, and the durability of a touch panel module is excellent.

Hereinafter, the structure of the conductive sheet of the present invention will be described with reference to drawings. FIG. 1 is a cross-sectional view of an embodiment of the conductive sheet of the present invention.

A conductive sheet 10 includes a support 12 and a conductive portion 16 composed of a plurality of thin conductive wires 14.

Hereinafter, each layer constituting the conductive sheet 10 will be specifically described.

<Support>

The type of the support is not limited as long as it can support the conductive portion which will be described later. The support is preferably a transparent support, and particularly preferably a plastic film. If transparent support is used, the conductive sheet of the present invention can be suitably used as a transparent conductive sheet.

Specific examples of the preferable materials constituting the support include plastic films having a melting point of equal to or less than about 290° C., such as PET (258° C.), polycycloolefin (134° C.), polycarbonate (250° C.), an acryl film (128° C.), PEN (269° C.), PE (135° C.), PP (163° C.), polystyrene (230° C.) polyvinyl chloride (180° C.), polyvinylidene chloride (212° C.), and TAC (290° C.). Among these, PET, polycyloolefin, and polycarbonate are particularly preferable. The numerical value in the parenthesis is a melting point. The total light transmittance of the support is preferably 85% to 100%.

The thickness of the support is not particularly limited. However, in view of applying the conductive sheet to a touch panel, an electromagnetic wave shield, and the like, generally, the thickness of the support can be randomly selected within a range of 25 μm to 500 μm. When the support is caused to function as a support of a transparent conductive film and as a touch surface, the support can also be designed to have a thickness exceeding 500 μm.

As one of the preferred embodiments of the support, there can be exemplified a treated support having undergone at least one type of treatment selected from the group consisting of atmospheric pressure plasma treatment, corona discharge treatment, and ultraviolet irradiation treatment. If the above treatment is performed on the support, a hydrophilic group such as an OH group is introduced onto the surface of the treated support, and the adhesiveness of the conductive portion which will be described later is further improved.

Among the above treatment, in view of further improving the adhesiveness of the conductive portion, the atmospheric pressure plasma treatment is preferable.

As another preferred embodiment of the support, the support preferably has an undercoat layer, which contains a polymer different from gelatin which will be described later, on the surface thereof. If the photosensitive layer is formed on the undercoat layer, the adhesiveness of the conductive portion which will be described later is further improved.

The method for forming the undercoat layer is not particularly limited, and for example, there can be exemplified a method of coating the support with a composition for forming an undercoat layer containing a polymer different from gelatin and performing heating treatment on the support if necessary. If necessary, the composition for forming an undercoat layer may contain a solvent. The type of the solvent is not particularly limited, and examples thereof include the solvents used in a composition for forming a photosensitive layer which will be described later. Furthermore, as the composition for forming an undercoat layer containing a polymer different from gelatin, latex containing fine particles of a polymer different from gelatin may be used.

The thickness of the undercoat layer is not particularly limited. However, in view of better adhesiveness of the conductive portion, the thickness of the undercoat layer is preferably 0.02 μm to 0.3 μm, and more preferably 0.03 μm to 0.2 μm.

<Conductive Portion>

The conductive portion is composed of thin conductive wires disposed on a support, and the thin conductive wires contain metal silver and a binder. FIG. 1 shows an embodiment in which the thin conductive wires 14 are formed only on one surface of the support 12. However, the present invention is not limited to the embodiment, and the thin conductive wires 14 may be disposed on both surfaces of the support 12.

Furthermore, in FIG. 1, there are four thin conductive wires 14 in the conductive portion 16, but the number of the thin conductive wires 14 is not particularly limited.

A volume ratio (A/B) of a volume A of the metal silver to a volume B of the gelatin in the thin conductive wires is 0.3 to 10.0. Particularly, in view of further inhibiting ion migration, the volume ratio (A/B) is preferably 0.3 to 3.0, more preferably 0.3 to 2.0, and even more preferably 0.4 to 1.0.

When the volume ratio (A/B) is less than 0.3 or greater than 10.0, the ion migration inhibition effect deteriorates.

The volume A of the metal silver and the volume B of the gelatin are measured by the following method. By fluorescent X-ray analysis, the content of the metal silver is measured and expressed as a volume in terms of a specific gravity. Furthermore, by a BCA method (bicinchoninic acid method), the content of the gelatin is measured and expressed as a volume in terms of a specific gravity.

The portions (regions 18) between the thin conductive wires 14 on the support 12 shown in FIG. 1 substantially do not contain gelatin. The state in which the regions 18 substantially do not contain gelatin means that the content of the gelatin is less than 0.002 mg/cm$^2$. In view of further inhibiting ion migration, the content of the gelatin is preferably equal to or less than 0.001 mg/cm$^2$, and more preferably equal to or less than 0.0005 mg/cm$^2$. The lower limit of the content of the gelatin is not particularly limited, but is preferably 0 mg/cm$^2$.

In a more preferred embodiment, the entire surface of the support 12 except for the regions, in which the thin conductive wires 14 are disposed, substantially does not contain the gelatin.

The line width of the thin conductive wires is not particularly limited. However, the line width is preferably equal to or less than 30 μm, more preferably equal to or less than 15 μm, even more preferably equal to or less than 10 μm, particularly preferably equal to or less than 9 μm, and most preferably equal to or less than 7 μm. Furthermore, the line width is preferably equal to or greater than 0.5 μm, and more preferably equal to or greater than 1.0 μm. If the line width is within the above range, an electrode with low resistance can be relatively easily formed.

When the thin conductive wires are used as peripheral wirings (lead-out wirings) in a conductive sheet for a touch panel, the line width of the thin conductive wires is preferably equal to or less than 500 μm, more preferably equal to or less than 50 μm, and particularly preferably equal to or less than 30 μm. If the line width is within the above range, touch panel electrodes with low resistance can be relatively easily formed.

In addition, when the thin conductive wires are used as the peripheral wirings in a conductive sheet for a touch panel, the thin conductive wires in the form of mesh pattern electrodes can be used as the peripheral wirings. In this case, the line width of the thin conductive wires is not particularly limited, but the line width is preferably equal to or less than 30 μm, more preferably equal to or less than 15 μm, even more preferably equal to or less than 10 μm, particularly preferably equal to or less than 9 μm, and most preferably equal to or less than 7 μm. Furthermore, the line width is preferably equal to or greater than 0.5 μm, and more preferably equal to or greater than 1.0 μm. If the line width is within the above range, electrodes with low resistance can be relatively easily formed. If the peripheral wirings in the conductive sheet for a touch panel are formed as the mesh pattern electrodes, in a step of irradiating the conductive portion with pulsed light from a xenon flash lamp, the reduction in resistance resulting from the irradiation of the sensing electrodes and the peripheral wirings can be more uniformly accomplished. Furthermore, when a transparent adhesive layer is pasted to the conductive portion, the peel strength of the sensing electrodes and the peripheral wirings can be made constant, and in addition, the in-plane distribution of the peel strength can be reduced.

Therefore, it is preferable that the thin conductive wires in the form of the mesh pattern electrodes are used as the peripheral wirings in the conductive sheet for a touch panel.

The thickness of the thin conductive wires is not particularly limited, but the thickness is preferably 0.001 mm to 0.2 mm, more preferably equal to or less than 30 µm, even more preferably equal to or less than 20 µm, particularly preferably 0.01 µm to 9 µm, and most preferably 0.05 µm to 5 µm. If the thickness is within the above range, an electrode with low resistance and excellent durability can be relatively easily formed.

Figure 2:
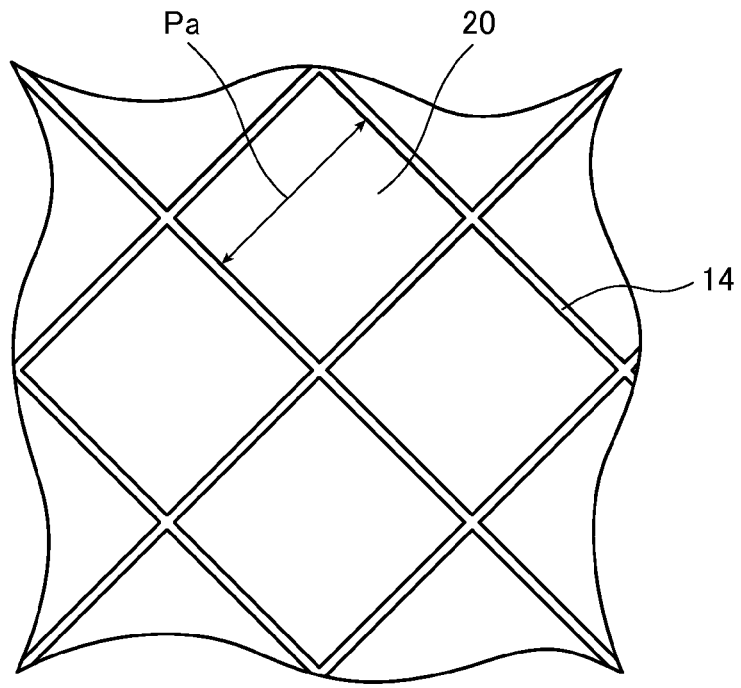
FIG. 2 is a partial plan view showing an embodiment of a conductive portion formed of thin conductive wires.

The pattern of the conductive portion composed of the thin conductive wires is not particularly limited. The pattern is preferably a geometrical figure as a combination of a triangle such as a regular triangle, an isosceles triangle, or a right-angled triangle, a quadrangle such as a square, a rectangle, a rhombus, a parallelogram, or a trapezoid, an n-sided (regular) polygon such as a (regular) hexagon or a (regular) octagon, a circle, an ellipse, a shape of a star, and the like. The pattern is more preferably a mesh shape composed of these geometrical figures. The mesh shape refers to a shape that includes a plurality of square lattices 20 constituted with the thin conductive wires 14 crossing each other as shown in FIG. 2.

A length Pa of one side of the lattice 20 is not particularly limited, but the length Pa is preferably 50 µm to 500 µm, and more preferably 150 µm to 300 µm. If the length of one side of the unit lattice is within the above range, the transparency can be excellently maintained, and when the conductive sheet is attached to the front surface of a display apparatus, a user can visually recognize the display by the display apparatus without feeling uncomfortable.

In view of visible light transmittance, the opening ratio of the conductive portion formed of the thin conductive wires is preferably equal to or greater than 85%, more preferably equal to or greater than 90%, and most preferably equal to or greater than 95%. The opening ratio corresponds to a proportion of a region on the support except for the region, in which the thin conductive wires are disposed, in the entire support.

The thin conductive wires contain metal silver.

The thin conductive wires may contain a metal (for example, gold or copper) other than the metal silver.

The thin conductive wires contain gelatin.

The type of the gelatin is not particularly limited. For example, in addition to lime-treated gelatin, acid-treated gelatin may be used. Moreover, it is possible to use a hydrolysate of gelatin, an enzymatic decomposition product of gelatin, and gelatin modified with an amino group or a carboxyl group (phthalated gelatin or acetylated gelatin).

The thin conductive wires may contain a component other than the metal silver and gelatin.

For example, the thin conductive wires may contain a polymer different from gelatin that will be described later. When the thin conductive wires contain the polymer different from gelatin, the mass ratio (metal silver/polymer different from gelatin) of the metal silver to the polymer different from gelatin in the thin conductive wires is not particularly limited. However, because the strength of the thin conductive wires is further improved, and ion migration is further inhibited, the mass ratio is preferably 0.3 to 0.9 and more preferably 0.4 to 0.7.

The polymer different from gelatin (hereinafter, simply referred to as also a polymer) is preferably a polymer not containing a protein. In other words, the polymer is preferably a polymer not decomposed by protease.

More specifically, examples of the polymer include at least any resin selected from the group consisting of an acryl-based resin, a styrene-based resin, a vinyl-based resin, a polyolefin-based resin, a polyester-based resin, a polyurethane-based resin, a polyamide-based resin, a polycarbonate-based resin, a polydiene-based resin, an epoxy-based resin, a silicone-based resin, a cellulose-based polymer, a chitosan-based polymer, a copolymer composed of a monomer constituting these resins, and the like. Among these, preferable examples of the polymer include an acryl-based resin, a styrene-based resin, a polyester-based resin, a copolymer composed of a monomer constituting these resins, and the like.

The polymer may contain a reactive group which can react with a crosslinking group in a crosslinking agent which will be described later. The type of the reactive group is not particularly limited, and the reactive group only needs to be able to react with the crosslinking group. Examples of the reactive group include a hydroxyl group, an isocyanate group, a carboxylic acid group, a carboxylic anhydride group, an epoxy group, an amino group, an alkyl halide group, and the like.

Particularly, examples of preferred embodiments of the polymer include a polymer (copolymer) represented by the following Formula (1) since the polymer can further prevent the permeation of moisture.

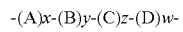 Formula (1):

In Formula (1), each of A, B, C, and D represents the following repeating unit.

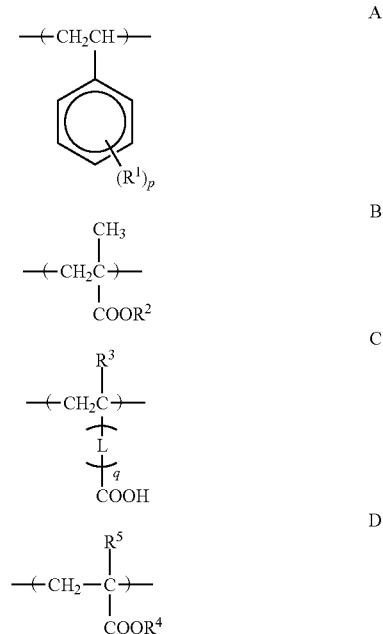

$R^1$ represents a methyl group or a halogen atom, and preferably represents a methyl group, a chlorine atom, or a bromine atom. p represents an integer of 0 to 2. p is preferably 0 or 1, and more preferably 0.

$R^2$ represents a methyl group or an ethyl group, and preferably represents a methyl group.

$R^3$ represents a hydrogen atom or a methyl group, and preferably represents a hydrogen atom. L represents a divalent linking group. L is preferably a group represented by the following Formula (2).

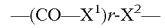 Formula (2):

In the formula, $X^1$ represents an oxygen atom or $-NR^{30}-$. Herein, $R^{30}$ represents a hydrogen atom, an alkyl group, an aryl group, or an acyl group, and each of these may have a substituent (for example, a halogen atom, a nitro group, a hydroxyl group, or the like). $R^{30}$ is preferably a hydrogen atom, an alkyl group having 1 to 10 carbon atoms (for example, a methyl group, an ethyl group, a n-butyl group, a n-octyl group, or the like), or an acyl group (for example, an acetyl group, a benzoyl group, or the like). $X^1$ is particularly preferably an oxygen atom or —NH—.

$X^2$ represents an alkylene group, an arylene group, an alkylene arylene group, an arylene alkylene group, or an alkylene arylene alkylene group. —O—, —S—, —OCO—, —CO—, —COO—, —NH—, —SO$_2$—, —N(R$^{31}$)—, —N(R$^{31}$)SO$_2$—, or the like may be inserted into the aforementioned groups. Herein, $R^{31}$ represents a linear or branched alkyl group having 1 to 6 carbon atoms, which includes a methyl group, an ethyl group, an isopropyl group, and the like. Preferable examples of $X^2$ include a dimethylene group, a trimethylene group, a tetramethylene group, an o-phenylene group, a m-phenylene group, a p-phenylene group, —CH$_2$CH$_2$OCOCH$_2$CH$_2$—, —CH$_2$CH$_2$OCO(C$_6$H$_4$)—, and the like.

r represents 0 or 1.

q represents 0 or 1, and preferably represents 0.

$R^4$ represents an alkyl group having 5 to 80 carbon atoms, an alkenyl group having 5 to 80 carbon atoms, or an alkynyl group having 5 to 80 carbon atoms. $R^4$ is preferably an alkyl group having 5 to 50 carbon atoms, more preferably an alkyl group having 5 to 30 carbon atoms, and even more preferably an alkyl group having 5 to 20 carbon atoms.

$R^5$ represents a hydrogen atom, a methyl group, an ethyl group, a halogen atom, or —CH$_2$COOR$^6$. $R^5$ is preferably a hydrogen atom, a methyl group, a halogen atom, or —CH$_2$COOR$^6$, more preferably a hydrogen atom, a methyl group, or —CH$_2$COOR$^6$, and particularly preferably a hydrogen atom.

$R^6$ represents a hydrogen atom or an alkyl group having 1 to 80 carbon atoms, and may be the same as or different from $R^4$. The number of carbon atoms of $R^6$ is preferably 1 to 70, and more preferably 1 to 60.

In Formula (1), each of x, y, z, and w represents a molar ratio of each of the repeating units.

x represents 3 mol % to 60 mol %, preferably represents 3 mol % to 50 mol %, and more preferably represents 3 mol % to 40 mol %.

y represents 30 mol % to 96 mol %, preferably represents 35 mol % to 95 mol %, and particularly preferably represents 40 mol % to 90 mol %.

If z is too small, the affinity with hydrophilic protective colloid such as gelatin is reduced, and consequently, a matting agent is highly likely to be aggregated and peeled off. If z is too large, the matting agent of the present invention dissolves in an alkaline treatment solution for a photosensitive material. Therefore, z represents 0.5 mol % to 25 mol %, preferably represents 0.5 mol % to 20 mol %, and particularly preferably represents 1 mol % to 20 mol %.

w represents 0.5 mol % to 40 mol, and preferably represents 0.5 mol % to 30 mol %.

It is particularly preferable that, in Formula (1), x represents 3 mol % to 40 mol %, y represents 40 mol % to 90 mol %, z represents 0.5 mol % to 20 mol, and w represents 0.5 mol % to 10 mol %.

As the polymer represented by Formula (1), a polymer represented by the following Formula (2) is preferable.

Formula (2)

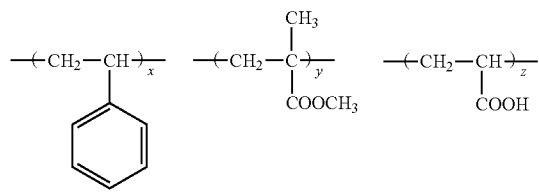

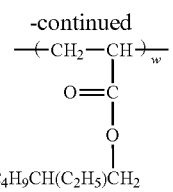

In Formula (2), x, y, z, and w have the same definition as described above.

The polymer represented by Formula (1) may contain other repeating units in addition to Formulae (A), (B), (C), and (D). Examples of monomers for forming other repeating units include acrylic acid esters, methacrylic acid esters, vinyl esters, olefins, crotonic acid esters, itaconic acid diesters, maleic acid diesters, fumaric acid diesters, acrylamides, unsaturated carboxylic acids, an allyl compound, vinyl ethers, vinyl ketones, a vinyl heterocyclic compound, glycidyl esters, unsaturated nitriles, and the like. These monomers are also described in paragraphs [0010] to [0022] of JP 3754745 B.

From the viewpoint of hydrophobicity, acrylic acid esters and methacrylic acid esters are preferable, and hydroxyalkyl methacrylate such as hydroxyethyl methacrylate or hydroxyalkyl acrylate is more preferable. The polymer represented by Formula (1) preferably contains a repeating unit represented by the following Formula (E) in addition to Formulae (A), (B), (C), and (D).

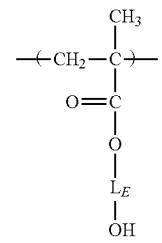

E

In the formula, $L_E$ represents an alkylene group. $L_E$ is preferably an alkylene group having 1 to 10 carbon atoms, more preferably an alkylene group having 2 to 6 carbon atoms, and even more preferably an alkylene group having 2 to 4 carbon atoms.

The polymer represented by Formula (1) is particularly preferably a polymer represented by the following Formula (3).

Formula (3)

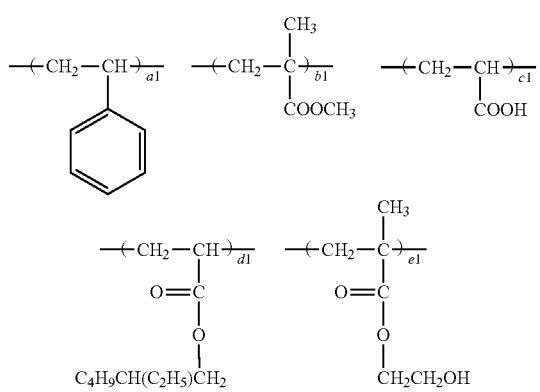

In the formula, each of a1, b1, c1, d1, and e1 represents a molar ratio of each monomer unit. a1 represents 3 (mol %) to 60 (mol %), b1 represents 30 (mol %) to 95 (mol %), c1 represents 0.5 (mol %) to 25 (mol %), d1 represents 0.5 (mol %) to 40 (mol %), and e1 represents 1 (mol %) to 10 (mol %).

The preferable range of a1 is the same as the preferable range of x, the preferable range of b1 is the same as the preferable range of y, the preferable range of c1 is the same as the preferable range of z, and the preferable range of d1 is the same as the preferable range of w.

e1 represents 1 mol % to 10 mol %, preferably represents 2 mol % to 9 mol %, and more preferably represents 2 mol % to 8 mol %.

Specific examples of the polymer represented by Formula (1) will be shown below, but the polymer is not limited to the examples.

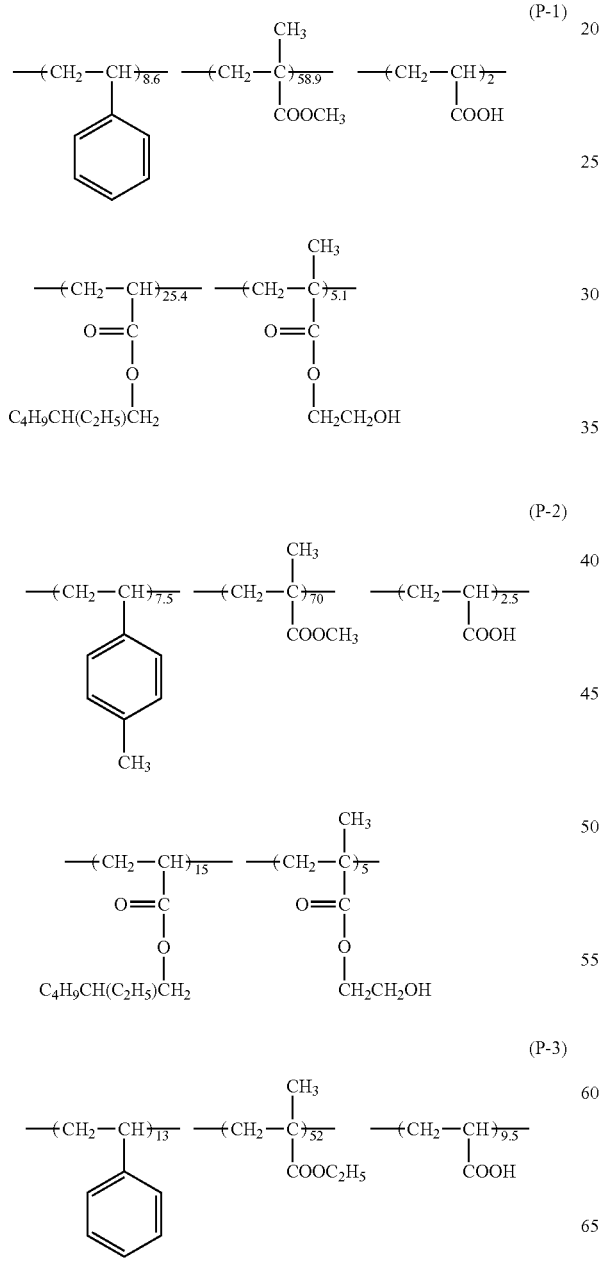
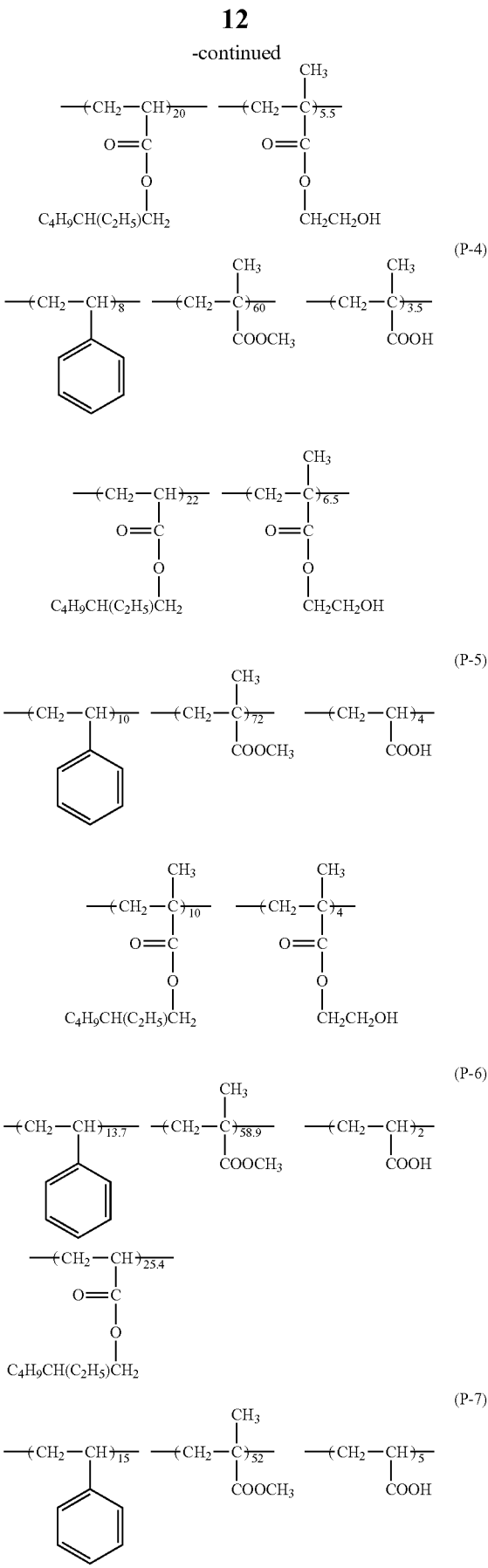

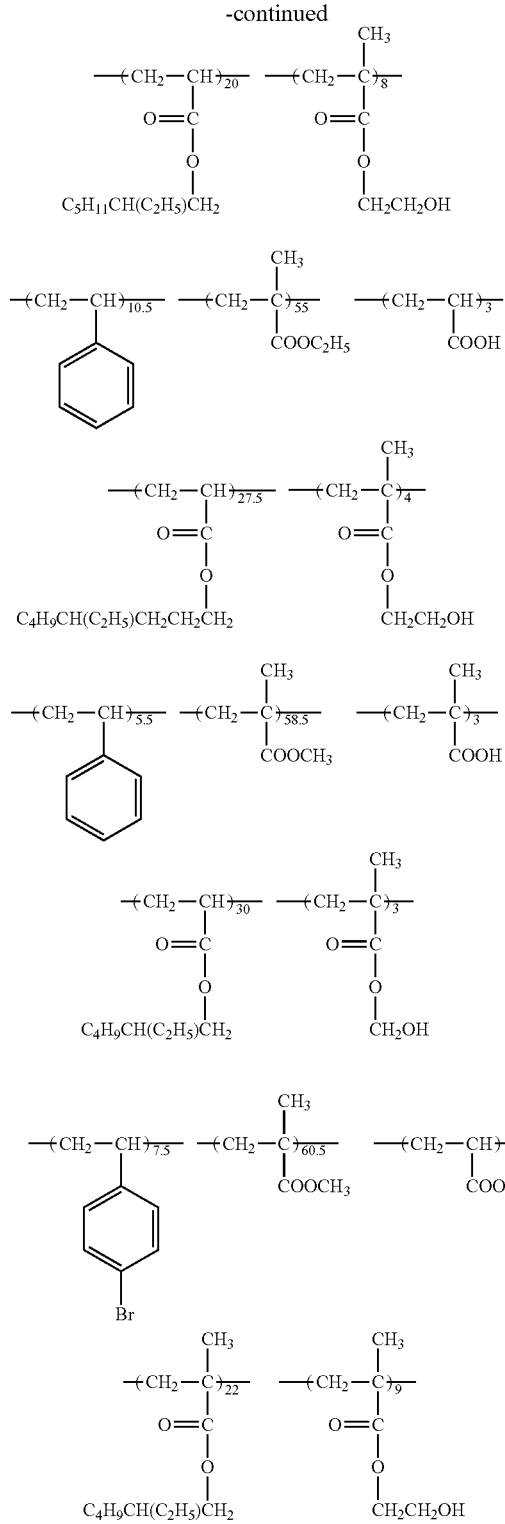

The weight average molecular weight of the polymer represented by Formula (1) is preferably 1,000 to 1,000,000, more preferably 2,000 to 750,000, and even more preferably 3,000 to 500,000.

The polymer represented by Formula (1) can be synthesized with reference to, for example, JP 3305459 B, JP 3754745 B, and the like.

<Conductive Sheet>

The conductive sheet 10 includes the support 12 and the conductive portion 16 composed of the aforementioned thin conductive wires 14.

If necessary, the conductive sheet 10 may include another layer (for example, an undercoat layer or an anti-halation layer) between the support 12 and the thin conductive wires 14.

The material used in the anti-halation layer and how to use the material are not particularly limited and exemplified in, for example, paragraphs [0029] to [0032] of JP 2009-188360 A.

The conductive sheet can be used for various purposes. For example, the conductive sheet can be used for various electrodes (for example, an electrode for a touch panel, an electrode for an inorganic EL element, an electrode for an organic EL element, or an electrode for a solar cell), a heating sheet, or a printed wiring board. Among these, the conductive sheet is preferably used in a touch panel, and particularly preferably used in a capacitance-type touch panel. In this case, for example, the conductive sheet may constitute a detection electrode of the capacitance-type touch panel or constitute a lead-out wiring connected to the detection electrode.

The conductive sheet has excellent durability. Therefore, the conductive sheet can also be applied to a touch panel having a three-dimensional shape in which a sensor portion is disposed on a curved surface.

Furthermore, as another purpose, the conductive sheet can also be used as an electromagnetic wave shield which shields electromagnetic waves such as radio waves or microwaves (ultrahigh frequency waves) generated from a personal computer, a work station, and the like and also prevents static electricity. In addition to the electromagnetic wave shield used in the mainframe of a personal computer, the conductive sheet can also be used as an electromagnetic wave shield used in an image capturing device, an electronic medical device, or the like.

Moreover, the conductive sheet can be used as a transparent heating element.

Among these, the application of the conductive sheet to a touch panel is particularly preferable. When the conductive sheet is applied to a touch panel, a transparent adhesive layer may be disposed on the conductive portion of the conductive sheet.

As a preferred embodiment of the touch panel including the conductive sheet of the present invention, there is a touch panel which includes a transparent adhesive layer disposed on the conductive portion of the conductive sheet. In such a touch panel, the acid value and the water absorption rate of an adhesive contained in the transparent adhesive layer are equal to or less than 100 mg KOH/g and equal to or less than 1.0% respectively. In the touch panel of the aforementioned embodiment, the ion migration between the thin conductive wires is further inhibited.

The acid value of the adhesive in the transparent adhesive layer is preferably equal to or less than 100 mg KOH/g. Particularly, in view of further inhibiting ion migration, the acid value is more preferably 0 mg KOH/g to 60 mg KOH/g, and even more preferably 0 mg KOH/g to 40 mg KOH/g.

The acid value is a value measured by using a neutralization titration method based on JIS K0070:1992 "Test methods for acid value, saponification value, ester value, iodine value, hydroxyl value, and unsaponifiable matter of chemical products".

The water absorption rate of the adhesive is preferably equal to or less than 1.0%. Particularly, in view of further inhibiting ion migration, the water absorption rate is more preferably 0% to 0.95%, even more preferably 0% to 0.90%, and particularly preferably 0% to 0.80%.

The water absorption rate of the adhesive is calculated as below.

The adhesive with a size of 5 cm×5 cm×100 μm (thickness) is pasted onto a copper plate and then left to stand for 24 hours in an environment of a temperature of 85° C. and humidity of 85%. From the change in weight of the adhesive before and after the adhesive is left to stand in the aforementioned environment, the water absorption rate is calculated using an equation of [{(weight of adhesive after being left to stand)−(weight of adhesive before being left to stand)}/(weight of adhesive before being left to stand)×100]. Herein, after being taken out of a thermohygrostat bath, the adhesive is left to stand for 5 minutes until the weight thereof is stabilized, and then the weight thereof is measured.

As the adhesive, an adhesive insulating material is preferable.

An acryl-based adhesive insulating material, which is a preferred embodiment of the aforementioned adhesive insulating material, is a material that contains, as a main component, an acryl-based polymer having a repeating unit derived from alkyl (meth)acrylate. Herein, the (meth)acrylate refers to either or both of acrylate and methacrylate. Among the acryl-based adhesive insulating materials, in view of better adhesiveness, an acryl-based polymer having a repeating unit derived from alkyl (meth)acrylate in which an alkyl group has about 1 to 12 carbon atoms is preferable. Furthermore, because the rate of change in mutual capacitance is further reduced, an acryl-based polymer having a repeating unit derived from alkyl methacrylate having about 1 to 12 carbon atoms and a repeating unit derived from alkyl acrylate having about 1 to 12 carbon atoms is more preferable.

The repeating unit in the aforementioned acryl-based polymer may contain a repeating unit derived from (meth)acrylic acid.

<Preferred Embodiment of Conductive Sheet>

Figure 3:
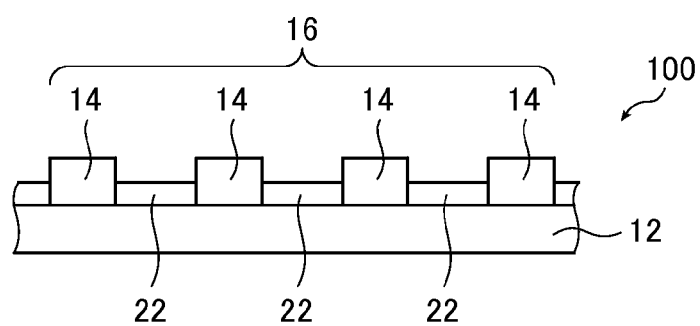
FIG. 3 is a cross-sectional view of another embodiment of the conductive sheet of the present invention.

As a preferred embodiment of the conductive sheet, a conductive sheet having a binder portion between the thin conductive wires on a support is exemplified. In the conductive sheet, the binder portion contains a polymer different from gelatin and substantially does not contain gelatin. More specifically, a conductive sheet 100 is exemplified which includes the support 12, the conductive portion 16 composed of the thin conductive wires 14 disposed on the support 12, and a binder portion 22 disposed between the thin conductive wires 14 as shown in FIG. 3. Because the binder portion 22 is disposed between the thin conductive wires 14, ion migration between the thin conductive wires 14 is further inhibited.

Except for the binder portion 22, the embodiment of the conductive sheet 100 shown in FIG. 3 is the same as the embodiment of the conductive sheet 10 shown in FIG. 1. Therefore, hereinafter, the same constitution will not be described, and the binder portion 22 will be specifically described.

(Binder Portion)

The binder portion is a layer disposed at least between the thin conductive wires. As a more preferred embodiment, the support surface on which the thin conductive wires are disposed is covered with the thin conductive wires and the binder portion.

The binder portion contains a polymer different from gelatin. The definition of the polymer different from gelatin is as described above.

The binder portion substantially does not contain gelatin. As described above, the state in which the binder portion substantially does not contain gelatin means that the content of the gelatin in the binder portion is less than 0.002 mg/cm$^2$. In view of further inhibiting ion migration, the content of the gelatin is preferably equal to or less than 0.001 mg/cm$^2$, and more preferably equal to or less than 0.0005 mg/cm$^2$. The lower limit of the content of the gelatin is not particularly limited, but is preferably 0 mg/cm$^2$.

The amount of the gelatin in the binder portion refers to the content of the gelatin per unit area (m$^2$) in a projection plan view that is obtained when the binder portion is projected from a direction perpendicular to the surface of the binder portion.

The thickness of the binder portion is not particularly limited, but in many cases, the thickness of the binder portion is smaller than that of the thin conductive wires. The binder portion may contain a component other than the polymer different from gelatin.

<Manufacturing Method of Conductive Sheet>

The manufacturing method of the aforementioned conductive sheet is not particularly limited. However, in view of excellent productivity, a manufacturing method is preferable which includes at least a step A of forming a predetermined silver halide-containing photosensitive layer on a support, a step B of performing exposure and development treatment on the silver halide-containing photosensitive layer, a step C of performing heating treatment on the resultant of the step B, and a step D of treating the resultant of the step C with a protease.

Hereinafter, the materials used in each step and the procedure of each step will be specifically described with reference to FIGS. 4A to 4C.

[Step a (Silver Halide-Containing Photosensitive Layer Forming Step)]

The step A is a step of forming a silver halide-containing photosensitive layer (hereinafter, simply referred to as a "photosensitive layer"), which contains silver halide, gelatin, and a polymer different from gelatin and in which a mass ratio (Y/X) of a mass Y of the polymer to a mass X of the gelatin is equal to or greater than 0.1, on a support. By the step A, a support with a photosensitive layer to be subjected to exposure treatment, which will be described later, is manufactured.

More specifically, as shown in FIG. 4A, a silver halide-containing photosensitive layer 26 is formed on the support 12. The photosensitive layer 26 contains silver halide 24 (for example, silver bromide particles, silver chlorobromide particles, or silver iodobromide particles), gelatin, and a polymer different from gelatin. In FIGS. 4A and 4B, the silver halide 24 is described as "dots". However, the drawings show the silver halide 24 in an exaggerated form for facilitating understanding of the present invention, and do not describe the size, concentration, or the like thereof. Hereinafter, the silver halide-containing photosensitive layer will also be simply referred to as a photosensitive layer.

First, the materials and members used in the step A will be specifically described, and then the procedure of the step A will be specifically described.

The definitions of the support, the gelatin, and the polymer different from gelatin used in the step A are as described above.

(Silver Halide)

The halogen element contained in the silver halide may be any one of chlorine, bromine, iodine, and fluorine, and these elements may be used in combination. For example, silver halide mainly constituted with silver chloride, silver bromide, or silver iodide is preferably used, and silver halide mainly constituted with silver bromide or silver chloride is more preferably used. Silver chlorobromide, silver iodochlorobromide, and silver iodobromide are also preferably used. Among these, silver chlorobromide, silver bromide, silver iodochlorobromide, and silver iodobromide are more preferable, and silver chlorobromide and silver iodochlorobromide containing silver chloride in an amount of equal to or greater than 50 mol % are most preferably used.

Herein, the "silver halide mainly constituted with silver bromide" refers to silver halide in which a molar fraction of bromide ions in a silver halide composition is equal to or greater than 50%. Particles of the silver halide mainly constituted with silver bromide may contain iodide ions or chloride ions in addition to the bromide ions.

The silver halide is in the form of solid particles. From the viewpoint of patterning properties of the conductive portions formed after the exposure and development treatment, the average particle size of the silver halide is preferably 0.1 nm to 1,000 nm (1 μm), more preferably 0.1 nm to 100 nm, and even more preferably 1 nm and 50 nm, in terms of a sphere equivalent diameter.

The "sphere equivalent diameter" of the silver halide particles means a diameter of particles having a spherical particle shape and the same volume.

The shape of the silver halide particles is not particularly limited, and the particles can have various shapes such as a spherical shape, a cuboid shape, a flat plate shape (a hexagonal flat plate shape, a triangular flat plate shape, a quadrangular flat plate shape, or the like), an octahedral shape, and a cuboctahedral shape.

Furthermore, regarding the use of metal compounds belonging to groups VIII and VIIIB, such as a rhodium compound and an iridium compound, and a palladium compound that are used for stabilizing silver halide and for increasing sensitivity of silver halide, the description in paragraphs [0039] to [0042] of JP 2009-188360 A can be referred to. Moreover, regarding chemical sensitization, the technique described in paragraph [0043] of JP 2009-188360 A can be referred to.

(Others)

If necessary, the silver halide-containing photosensitive layer may contain materials other than the aforementioned materials. Examples of such materials include a metal compound belonging to group VIII and group VIIB such as a rhodium compound and an iridium compound used for stabilizing and highly sensitizing silver halide, and also include an antistatic agent, a nucleating agent, a spectral sensitizing dye, a surfactant, an anti-fogging agent, a film hardening agent, a black spot inhibitor, a redox compound, a monomethine compound, dihydroxybenzenes, and the like described in paragraphs [0220] to [0241] of JP 2009-004348 A. Furthermore, the composition for forming a photosensitive layer may also contain a physical development nucleus.

Particularly, the silver halide-containing photosensitive layer preferably contains a crosslinking agent used for crosslinking the aforementioned polymers to each other. If the silver halide-containing photosensitive layer contains the crosslinking agent, cross-linking proceeds between the polymers, and the metal silver particles in the conductive portion remain linked to each other even after the gelatin is decomposed and removed in the step D which will be described later. Consequentially, a conductive film having excellent conductivity is obtained.

The type of the crosslinking agent used is not particularly limited, and depending on the structure of the polymer used, an optimal crosslinking agent is appropriately selected. Generally, the crosslinking agent has at least two crosslinking groups that react with the group (reactive group) contained in the polymer.

In view of better reactivity, examples of suitable combinations of the reactive group in the polymer and the crosslinking group in the crosslinking agent include the following (1) to (8).

(1) A hydroxyl group with an isocyanate group
(2) A carboxylic acid group with an epoxy group
(3) A hydroxyl group with a carboxylic anhydride group
(4) A carboxylic acid group with an isocyanate group
(5) An amino group with an isocyanate group
(6) A hydroxyl group with an epoxy group
(7) An amino group with an epoxy group
(8) An amino group with an alkyl halide group That is, examples of the crosslinking group include a hydroxyl group, an isocyanate group, a carboxylic acid group, a carboxylic anhydride group, an epoxy group, an amino group, an alkyl halide group, and the like.

Examples of the crosslinking agent include vinyl sulfones (for example, 1,3-bisvinylsulfonyl propane), aldehydes (for example, glyoxal), pyrimidine chlorides (for example, 2,4,6-trichloropyrimidine), triazine chlorides (for example, cyanuric chloride), an epoxy compound, a carbodimide compound, and the like. Furthermore, a crosslinking agent may be used which causes a crosslinking reaction by using a photochemical reaction induced by light irradiation.

As the epoxy compound, epoxy compounds such as 1,4-bis(2',3'-epoxypropyloxy)butane, 1,3,5-triglycidyl isocyanurate, 1,3-diglycidyl-5-(γ-acetoxy-β-oxypropyl)isocyanurate, sorbitol polyglycidyl ethers, polyglycerol polyglycidyl ethers, pentaerythritol polyglycidyl ethers, diglycerol polyglycidyl ether, 1,3,5-triglycidyl(2-hydroxyethyl)isocyanurate, glycerol polyglycerol ethers, and trimethylolpropane polyglycidyl ethers are preferable. Specific examples of commercially available products of the epoxy compounds include Denacol EX-521 or EX-614B (trade names, manufactured by Nagase Kasei Kogyo Co., Ltd.), EPDXY RESIN DY 022 (manufactured by Nagase ChemteX Corporation), and the like, but the epoxy compound is not limited to these.

As the carbodimide compound, a compound having a plurality of carbodimide structures in a molecule is preferably used. The polycarbodimide is generally synthesized by a condensation reaction of organic diisocyanate. The organic group of the organic diisocyanate used for synthesizing the compound having a plurality of carbodimide structures in a molecule is not particularly limited. As the organic group, it is possible to use any of aromatic organic groups and aliphatic organic groups or to use a mixture of these. However, from the viewpoint of reactivity, aliphatic organic groups are particularly preferable. As the raw materials of synthesis, organic isocyanate, organic diisocyanate, organic triisocyanate, and the like are used. As the organic isocyanate, for example, aromatic isocyanate, aliphatic isocyanate, and a mixture of these can be used. Specifically, 4,4'-diphenylmethane diisocyanate, 4,4-diphenyldimethylmethane diisocyanate, 1,4-phenylene diisocyanate, 2,4-tolylene diisocyanate, 2,6-tolylene diisocyanate, hexamethylene diisocyanate, cyclohexane diisocyanate, xylylene diisocyanate, 2,2,4-trimethylhexamethylene diisocyanate, 4,4'-dicyclohexylmethane diisocyanate, 1,3-phenylene diisocyanate, and the like are used. As the organic monoisocyanate, isophorone isocyanate, phenyl isocyanate, cyclohexyl isocyanate, butyl isocyanate, naphthyl isocyanate, and the like are used. Specifically, as commercially available products of the carbodiimide-based compound, for example, Carbodilite V-02-L2 (trade name: manufactured by Nisshinbo Chemical Inc.) and the like are available.

The content of the crosslinking agent in the photosensitive layer is not particularly limited. However, in view of a better ion migration-inhibiting ability, the content of the crosslinking agent is preferably 0.02 g/m² to 3.0 g/m², and more preferably 0.05 g/m² to 2.0 g/m².

From the viewpoint of productivity, the silver halide-containing photosensitive layer preferably contains a film hardening agent that cross-links the gelatin molecules to each other.

The type of the film hardening agent is not particularly limited, and examples thereof include vinyl sulfones (for example, 1,3-bisvinylsulfonyl propane), aldehydes (for example, glyoxal), pyrimidine chlorides (for example, 2,4,6-trichloropyrimidine), triazine chlorides (for example, cyanuric chloride), an epoxy compound, a carbodimide compound, and the like.

Furthermore, the type of the film hardening agent may be the same as the type of the crosslinking agent cross-linking the aforementioned polymers to each other. That is, the film hardening agent may be a compound that crosslinks the gelatin molecules to each other while cross-linking the polymers to each other.

(Procedure of Step A)

In the step A, the method for forming the silver halide-containing photosensitive layer that contains the aforementioned components is not particularly limited. However, in view of productivity, a method is preferable in which the silver halide-containing photosensitive layer is formed on the support by bringing a composition for forming a photosensitive layer containing silver halide, gelatin, and a polymer into contact with the support.

Hereinafter, embodiments of the composition for forming a photosensitive layer used in such a method will be specifically described, and then the procedure of the step will be specifically described.

(Materials Contained in Composition for Forming Photosensitive Layer)

The composition for forming a photosensitive layer contains the aforementioned silver halide, gelatin, and polymer. Herein, the polymer may be contained in the composition for forming photosensitive layer, in the form of latex.

If necessary, the composition for forming a photosensitive layer contains a solvent.

Examples of the solvent used include water, an organic solvent (for example, alcohols such as methanol, ketones such as acetone, amides such as formamide, sulfoxides such as dimethyl sulfoxide, esters such as ethyl acetate, and ethers), ionic liquids, and a mixed solvent composed of these.

The content of the solvent used is not particularly limited. However, it is preferably within a range of 30% by mass to 90% by mass, and more preferably within a range of 50% by mass to 80% by mass, with respect to the total mass of the silver halide, the gelatin and the polymer.

The method of bringing the composition for forming a photosensitive layer into contact with the support is not particularly limited, and a known method can be used. For example, it is possible to use a method of coating the support with the composition for forming a photosensitive layer, a method of dipping the support into the composition for forming a photosensitive layer, and the like.

(Silver Halide-Containing Photosensitive Layer)

In the silver halide-containing photosensitive layer formed by the aforementioned procedure, a mass ratio (Y/X) of a mass Y of the polymer to a mass X of the gelatin is equal to or greater than 0.1. In view of better ion migration-inhibiting ability, the mass ratio (Y/X) is preferably equal to or greater than 0.2, and more preferably equal to or greater than 0.5. The upper limit thereof is not particularly limited. However, generally, the upper limit is equal to or less than 2.0 in many cases.

If the mass ratio (Y/X) is less than 0.1, the ion migration-inhibiting ability deteriorates.

The content of the silver halide in the silver halide-containing photosensitive layer is not particularly limited. However, in view of better conductivity of the thin conductive wires, the content of the silver halide is preferably 3.0 g/m² to 20.0 g/m², and more preferably 5.0 g/m² to 15.0 g/m² expressed in terms of silver.

Furthermore, the content of the polymer in the silver halide-containing photosensitive layer is not particularly limited. However, in view of better ion migration-inhibiting ability or better adhesiveness of the conductive portion, the content of the polymer is preferably 0.04 g/m² to 2.0 g/m², more preferably 0.8 g/m² to 0.4 g/m², and even more preferably 0.1 g/m² to 0.4 g/m².

[Step B (Exposure and Development Step)]

The step B is a step (exposure and development step) of forming a conductive portion composed of the thin conductive wires containing metal silver by performing exposure on the silver halide-containing photosensitive layer obtained by the step A and then performing development treatment on the silver halide-containing photosensitive layer having undergone the exposure treatment. By performing this step, the silver halide is reduced, and the conductive portion composed of the thin conductive wires containing metal silver is formed. Generally, the exposure treatment is performed patternwise, and in this way, the conductive portion composed of the thin conductive wires containing metal silver is formed in an exposed portion. In contrast, in an unexposed portion, the silver halide is eluted due to the development treatment which will be described later, and consequentially, a non-conductive portion containing the aforementioned gelatin and polymer is formed. The non-conductive portion substantially does not contain metal silver, and refers to a region that does not exhibit conductivity.

More specifically, as shown in FIG. 4B, exposure is performed on a silver halide-containing photosensitive layer 26. That is, the silver halide-containing photosensitive layer 26 is irradiated with light through a mask pattern corresponding to a predetermined exposure pattern. Alternatively, by performing digital writing exposure on the silver halide-containing photosensitive layer 26, a predetermined exposure pattern is formed in the silver halide-containing photosensitive layer 26. When receiving light energy, silver halide 24 is sensitized and generates a minute silver nucleus called a "latent image" that cannot be observed with the naked eye. Thereafter, development treatment is performed to amplify the latent image into a visualized image that can be observed with the naked eye, and as a result, as shown in FIG. 4C, thin conductive wires 14a and non-conductive portions 28 are formed. Herein, the thin conductive wires 14a contain a large amount of gelatin, and through the step D (gelatin removing treatment step) which will be described later, thin conductive wires that exhibit a predetermined volume ratio (A/B) are manufactured.

Hereinafter, the exposure treatment and the development treatment performed in the step B will be described.

(Exposure Step)

The exposure treatment is treatment for performing exposure on the photosensitive layer. By performing patternwise exposure on the photosensitive layer, the silver halide in the photosensitive layer within the exposed region forms a latent image. Within the region in which the latent image has been formed, the conductive portion is formed by the development treatment which will be described later. In contrast, within the unexposed region not having undergone exposure, the silver halide is dissolved at the time of the development treatment which will be described later and flows out of the photosensitive layer, and accordingly, a transparent film (non-conductive portion) is obtained.

The light source used at the time of exposure is not particularly limited. Examples thereof include light such as visible rays and ultraviolet rays, radiation such as X-rays, and the like.

The method for performing the pattern exposure is not particularly limited. For example, the pattern exposure may be performed by either surface exposure using a photomask or scanning exposure using laser beams. Herein, the shape of the pattern is not particularly limited, and appropriately adjusted depending on the pattern of the thin conductive wires to be formed.

(Development Step)

The method of the development treatment is not particularly limited, and for example, it can be selected from among the following three methods depending on the type of the photosensitive layer.

(1) A method of forming metal silver by performing chemical development or thermal development on a photosensitive layer not containing a physical development nucleus (2) A method of forming metal silver by performing dissolution physical development on a photosensitive layer containing a physical development nucleus (3) A method of forming metal silver by superimposing an image receiving sheet, which has a non-photosensitive layer containing a physical development nucleus, on a photosensitive layer not containing a physical development nucleus, and performing diffusion transfer development The chemical development, thermal development, dissolution physical development, and diffusion transfer development mentioned herein have the same meaning that are generally used in the field of related art, and are explained in general photographic chemistry textbooks, for example, "Photographic Chemistry" (Shinichi Kikuchi, KYORITSU SHUPPAN CO., LTD.) and "The Theory of Photographic Process, 4th ed." (C.E.K. Mees, Mcmillan, 1977). Furthermore, for example, the techniques described in JP 2004-184693 A, JP 2004-334077 A, JP 2005-010752 A, and the like can also be referred to.

Among the methods (1) to (3), in the method (1), the photosensitive layer having not yet been subjected to development does not have a physical development nucleus. Furthermore, the method (1) is not a diffusion transfer method using 2 sheets. Accordingly, the method (1) makes it possible to most simply and stably perform the treatment, and is preferable for manufacturing the conductive sheet of the present invention. While description below is based on the method (1), in the cases where other methods are used, the above-described textbooks can be referenced. Herein, the "dissolution physical development" is not a development method inherent in the method (2), and can be used in the method (1).

As the method of the development treatment, for example, it is possible to use the technique of general development treatment used for a silver halide photographic film, a photographic printing paper, a film for making a printing plate, an emulsion mask for a photomask, and the like.

The type of the developer used at the time of the development treatment is not particularly limited, and for example, it is possible to use a PQ developer, an MQ developer, an MAA developer, and the like. As commercially available products, for example, it is possible to use developers such as CN-16, CR-56, CP45X, FD-3, and Papitol formulated by FUJIFILM Corporation, C-41, E-6, RA-4, D-19, and D-72 formulated by KODAK, and developers included in the kit thereof. Furthermore, it is possible to use a lithographic developer.

The development treatment can include fixing treatment performed for stabilizing the photosensitive layer by removing silver halide in the unexposed portion. For the fixing treatment, it is possible to use the technologies of the fixing treatment used for a silver halide photographic film, a photographic printing paper, a film for making a printing plate, an emulsion mask for a photomask, and the like.

In the fixing treatment, the fixing temperature is preferably about 20° C. to about 50° C., and more preferably 25° C. to 45° C. The fixing time is preferably 5 seconds to 1 minute, and more preferably 7 seconds to 50 seconds.

The photosensitive layer having undergone the development and the fixing treatment is preferably subjected to washing treatment using water or to stabilization treatment. In the washing treatment using water or in the stabilization treatment, the amount of water used for washing is generally equal to or less than 20 L per 1 $m^2$ of the photosensitive material, and the amount of water replenished can be equal to or less than 3 L (the amount of water replenished may be 0, that is, the washing treatment may be performed using stored water).

The content of the metal silver contained in the exposed portion (conductive portion) having undergone the development treatment is preferably equal to or greater than 50% by mass, and more preferably equal to or greater than 80% by mass, with respect to the mass of silver contained in the exposed portion having not yet been subjected to exposure. If the content of the silver contained in the exposed portion is equal to or greater than 50% by mass with respect to the mass of the silver contained in the exposed portion having not yet been subjected to exposure, it is preferable since high conductivity can be obtained.

[Step C (Heating Step)]

The step C is a step of performing heating treatment on the support having the conductive portion and the non-conductive portion obtained in the step B. By performing the step C, the polymers different from gelatin in the conductive portion and the non-conductive portion are fused to each other and thus constitute a stronger layer. More specifically, the polymers different from gelatin are fused to each other and thus form a uniform film. If such a uniform film is formed, even after the gelatin is removed by a protease, the film strength can be maintained, and the increase in a haze value can be prevented.

Hereinafter, the heating treatment performed in the step C will be specifically described.

As the conditions of the heating treatment, optimal conditions are appropriately selected according to the type of the polymer used. However, it is preferable that the heating treatment is performed under a heating condition at a temperature equal to or higher than a glass transition point of the polymer different from gelatin.

As one of the methods of the heating treatment, treatment is exemplified in which the support having the conductive portion and the non-conductive portion is brought into contact with superheated vapor. The superheated vapor may be superheated water vapor or a mixture of superheated water vapor and other gases.

The superheated vapor is preferably brought into contact with the conductive portion for a supply time within a range of equal to or longer than 10 seconds and equal to or less than 70 seconds. If the supply time is equal to or longer than 10 seconds, the effect of improving conductivity is significant. Moreover, because the conductivity is not improved any further from around 70 seconds, the supply time set to be longer than 70 seconds is not preferable in view of economies.

It is preferable that the superheated vapor is brought into contact with the conductive portion in a supply amount within a range of 500 g/m$^3$ to 600 g/m$^3$. Moreover, it is preferable that the temperature of the superheated vapor is controlled to be 100° C. to 160° C. (preferably 100° C. to 120° C.) at 1 atm.

As another method of the heating treatment, a method is exemplified in which the heating treatment is performed at 100° C. to 200° C. (preferably at 100° C. to 150° C. and more preferably at 110° C. to 130° C.) for 1 minute to 240 minutes (preferably for 60 minutes to 150 minutes and more preferably for 90 minutes to 120 minutes).

[Step D (Gelatin Removing Treatment Step)]

The step D is a step (gelatin removing treatment step) of further treating the support having the conductive portion obtained in the step C with a protease that decomposes the gelatin. By performing the step D, the gelatin is decomposed and removed from the photosensitive layer (the conductive portion and the non-conductive portion) having undergone the exposure and development treatment. As a result, a conductive sheet is manufactured which includes the thin conductive wires containing the aforementioned metal silver and gelatin at a predetermined ratio and also includes the binder portion between the thin conductive wires, and ion migration between the thin conductive wires is further inhibited.

Hereinafter, first, the materials used in the step D will be specifically described, and then the procedure of the step D will be specifically described.

(Protease)

As the protease (hereinafter, also referred to as an "enzyme"), a known plant enzyme or animal enzyme that can hydrolyze a protein such as gelatin is used. Examples of the enzyme include pepsin, rennin, trypsin, chymotrypsin, cathepsin, papain, ficin, thrombin, renin, collagenase, bromelain, a bacterial protease, and the like. Among these, trypsin, papain, ficin, and a bacterial protease are particularly preferable. Especially, a bacterial protease (for example, Bioprase manufactured by NAGASE & CO., LTD.) can be easily purchased from the market at a low price.

(Procedure of Step)

The procedure of the step D is not particularly limited as long as the support having the conductive portion can be brought into contact with the aforementioned enzyme. Particularly, as long as a method which makes it possible to bring the conductive portion and the non-conductive portion on the support into contact with the enzyme is used, the procedure is not particularly limited. Generally, a method of bringing a treatment solution (enzyme solution) containing the aforementioned enzyme (hereinafter, simply referred to as a "treatment solution") into contact with the support having the conductive portion is used. Examples of the contact method include a method of coating the support having the conductive portion with the treatment solution, a method of dipping the support having the conductive portion into the treatment solution, and the like.

The content of the enzyme in the treatment solution is not particularly specified and can be arbitrarily determined according to the ability of the enzyme used and the required performance. Particularly, because the degree of removal and decomposition of the gelatin is easily controlled, it is appropriate for the content of the enzyme to be about 0.05% by mass to 20% by mass with respect to the total amount of the treatment solution. The content of the enzyme is more preferably 5%, by mass to 10% by mass with respect to the total amount of the treatment solution.

If necessary, the treatment solution can contain a pH buffer, an antibacterial compound, a wetting agent, a preservative, and the like, in addition to the enzyme.

Although the pH of the treatment solution is selected through experiments such that the activity of the enzyme is maximized, generally, the pH of the treatment solution is preferably 5 to 7. The temperature of the treatment solution is preferably set to be a temperature at which the activity of the enzyme is increased, specifically, a temperature of 25° C. to 45° C.

The contact time is not particularly limited, but it is preferably 10 seconds to 500 seconds, and more preferably 90 seconds to 360 seconds, because the ion migration-inhibiting ability of the conductive sheet is further improved.

If necessary, after the support is treated with the treatment solution, a step of washing the conductive sheet with hot water may be further provided. By providing this step, the residues of the decomposed gelatin, the rest of the protease, and the like can be removed, and ion migration is further inhibited.

The washing method is not particularly limited as long as the conductive sheet can be brought into contact with hot water. Examples of the washing method include a method of dipping the conductive sheet into hot water, a method of coating the conductive sheet with hot water, and the like.

As the temperature of the hot water, an optimal temperature is appropriately selected according to the type of the protease used and the like. However, in view of productivity, the temperature of the hot water is preferably 20° C. to 80° C., and more preferably 40° C. to 60° C.

The contact time between the hot water and the conductive sheet (washing time) is not particularly limited. However, in view of productivity, the contact time is preferably 1 second to 600 seconds, and more preferably 30 seconds to 360 seconds.

Through the aforementioned steps, the aforementioned conductive sheet can be manufactured. Particularly, by the method of the preferred embodiment described above, the conductive sheet shown in FIG. 3 that includes the conductive portion and the binder portion is manufactured.

[Other Preferred Embodiments of Manufacturing Method of Conductive Sheet]

The manufacturing method of a conductive sheet of the present invention may include other steps in addition to the aforementioned steps A to D.

Hereinafter, optional steps will be specifically described.

(Step E (Silver Halide-Free Layer Forming Step))

The manufacturing method of the present invention preferably further includes, before the step A, a step E of forming a silver halide-free layer, which contains gelatin and a polymer different from gelatin, on the support. By performing the present step, the silver halide-free layer is formed between the support and the silver halide-containing photosensitive layer formed by the step A. The silver halide-free layer plays a role of a so-called anti-halation layer and makes a contribution to the improvement of adhesiveness between the conductive portion and the support.

The silver halide-free layer contains the aforementioned gelatin and polymer, but does not contain silver halide.

The mass ratio (the mass of the polymer/the mass of the gelatin) of the polymer to the gelatin in the silver halide-free layer is not particularly limited. However, in view of better ion migration-inhibiting ability, the mass ratio is preferably 0.1 to 5.0, and more preferably 1.0 to 3.0.

The content of the polymer in the silver halide-free layer is not particularly limited. However, in view of better ion migration-inhibiting ability, the content of the polymer is preferably 0.03 g/m² to 1.63 g/m², and more preferably 0.325 g/m² to 0.975 g/m². Particularly, in view of excellent surface quality at the time of oxidation treatment, the content of the polymer is even more preferably 0.50 g/m² to 0.975 g/m², and particularly preferably 0.50 g/m² to 0.900 g/m².

If necessary, the silver halide-free layer may contain other materials in addition to the aforementioned materials. Examples of other materials include the aforementioned other materials (for example, an antistatic agent, a surfactant, an anti-fogging agent, a film hardening agent, and a black spot inhibitor) that may be contained in the silver halide-containing photosensitive layer.

Moreover, as the silver halide-containing photosensitive layer, the silver halide-free layer preferably contains a crosslinking agent used for cross-linking the polymers to each other. If the silver halide-free layer contains the crosslinking agent, crosslinking proceeds between the polymers. Accordingly, even after the gelatin is decomposed and removed in the step D, the metal silver particles in the conductive portion remain linked to each other, and consequentially, a conductive film having better conductivity is obtained. The type of the crosslinking agent is as described above.

Furthermore, as the silver halide-containing photosensitive layer, from the viewpoint of productivity, the silver halide-free layer preferably contains a film hardening agent cross-linking the gelatin molecules to each other. The type of the film hardening agent is as described above.

The method for forming the silver halide-free layer is not particularly limited, and examples thereof include a method of coating the support with a composition for forming a layer containing gelatin and a polymer, and performing heating treatment, if necessary.

If necessary, the composition for forming a layer may contain a solvent. As the type of the solvent, the aforementioned solvents used in the composition for forming a photosensitive layer are exemplified.

The thickness of the silver halide-free layer is not particularly limited, but generally, the thickness is preferably 0.05 μm to 2.0 μm, and more preferably 0.65 μm to 1.5 μm.

(Step F (Protective Layer-Forming Step))

The manufacturing method of the present invention preferably further includes, between the step A and the step B, a step F of forming a protective layer, which contains gelatin and a polymer different from gelatin, on the silver halide-containing photosensitive layer. If the protective layer is formed, it is possible to prevent scratches of the photosensitive layer or to improve dynamic characteristics of the photosensitive layer.

The mass ratio (the mass of the polymer/the mass of the gelatin) of the polymer to the gelatin in the protective layer is not particularly limited. However, in view of better ion migration-inhibiting ability, the mass ratio is preferably greater than 0 and equal to or less than 2.0, more preferably greater than 0 and equal to or less than 1.0, and even more preferably 0.05 to 0.075.

The content of the polymer in the protective layer is not particularly limited. However, in view of better ion migration-inhibiting ability, the content of the polymer is preferably greater than 0 g/m² and equal to or less than 0.3 g/m², and more preferably 0.075 g/m² to 0.01 g/m².

The method for forming a protective film is not particularly limited, and examples thereof include a method of coating the photosensitive layer with a composition for forming a protective layer containing gelatin and a polymer, and performing heating treatment, if necessary.

If necessary, the composition for forming a protective layer may contain a solvent. As the type of the solvent, the solvents used in the aforementioned composition for forming a photosensitive layer are exemplified.

The thickness of the protective layer is not particularly limited, but generally, it is preferably 0.03 μm to 0.3 μm, and more preferably 0.075 μm to 0.20 μm.

If necessary, the protective layer may contain other materials in addition to the aforementioned materials. Examples of other materials include the aforementioned other materials (for example, an antistatic agent, a surfactant, an anti-fogging agent, a film hardening agent, and a black spot inhibitor) that may be contained in the silver halide-containing photosensitive layer.

Moreover, as the silver halide-containing photosensitive layer, the protective layer preferably contains a crosslinking agent used for cross-linking the polymers to each other. If the protective layer contains the crosslinking agent, crosslinking proceeds between the polymers. Accordingly, even after the gelatin is decomposed and removed in the step D, the metal silver particles in the conductive portions remain linked to each other, and consequentially, a conductive film having better conductivity is obtained. The type of the crosslinking agent is as described above.

Furthermore, as the silver halide-containing photosensitive layer, from the viewpoint of productivity, the protective layer preferably contains a film hardening agent cross-linking the gelatin molecules to each other. The type of the film hardening agent is as described above.

(Step G (Reduction Step))

The manufacturing method of the present invention preferably further includes, between the steps B and D and/or after the step D, a step G of performing reduction treatment by treating the support having the conductive portions with a reducing aqueous solution. The technique of intensification described in "Intensification, Reduction, Toning, and other treatment" in Section 22 of "Chemistry of Photography" (Akira Sasai, Shashin Kogyo Shuppansha) can be referred to. By oxidating silver generated by the development treatment once and then performing reduction treatment again, a conductive sheet having higher conductivity can be obtained.

The type of the reducing aqueous solution is not particularly limited as long as reduction of silver can proceed. For example, it is possible to use a sodium sulfite aqueous solution, a hydroquinone aqueous solution, a paraphenylenediamine aqueous solution, an oxalic acid aqueous solution, an ascorbic acid aqueous solution, a sodium borohydride aqueous solution, and the like. The pH of these aqueous solutions is preferably equal to or higher than 10.

The treatment method is not particularly limited as long as the support having the conductive portion is brought into contact with the reducing aqueous solution. Examples of the treatment method include a method of dipping the support into the reducing aqueous solution.

(Step H (Light Irradiation Step))

The manufacturing method of the present invention preferably further includes, between the steps B and D and/or after the step D, a step H of irradiating the conductive portion with pulsed light from a xenon flash lamp. By performing the present step, the resistance of the conductive portion can be reduced. The reason why the conductivity of the conductive sheet is improved is indefinite. However, it is considered that by irradiating the conductive portion with pulsed light from a xenon flash lamp, at least a part of either or both of the polymer and the gelatin may partially evaporate due to heat, and thus metals (conductive substance) may easily bind to each other.

The irradiation amount of the pulsed light is not particularly limited. However, it is preferably equal to or greater than 1 J and equal to or less than 1,500 J, more preferably 100 J to 1,000 J, and even more preferably 500 J to 800 J, per pulse. The irradiation amount can be measured by using a general ultraviolet illuminometer. As the general ultraviolet illuminometer, for example, an illuminometer having a detection peak at 300 nm to 400 nm can be used.

For example, when the conductive sheet is used as an electrode for a touch panel, in order to prevent the conductive portion from becoming visible to the naked eye, the line width of the conductive portion is preferably 1 µm to 15 µm, and the thickness thereof is preferably 1 µm to 3 µm. When the line width and the thickness are within the above range, the number of times of radiating the pulsed light is preferably equal to or greater than 1 and equal to or less than 2,000, more preferably equal to or greater than 1 and equal to or less than 50, and even more preferably equal to or greater than 1 and equal to or less than 30.

(Step I (Smoothing Step))

The manufacturing method of the present invention preferably further includes, between the steps B and D and/or after the step D, a step I of performing smoothing treatment on the conductive portion. By performing the present step I, the conductivity and the adhesiveness of the conductive portion are improved, and the surface resistance is reduced.

The method of the smoothing treatment is not particularly limited. For example, the treatment can be performed by using calendar rolls. Generally, the calendar rolls are composed of a pair of rolls. Hereinafter, the smoothing treatment using the calendar rolls is described as calendar treatment.

As the rolls used in the calendar treatment, plastic rolls of epoxy, polyimide, polyamide, polyimide amide, and the like or metal rolls are used. In view of preventing wrinkling, it is preferable to use plastic rolls. The lower limit of the pressure of the rolls is preferably equal to or greater than 1 MPa, and more preferably equal to or greater than 4 MPa. The upper limit of the pressure is preferably equal to or less than 50 MPa. The pressure is measured by using Prescale (for high pressure) manufactured by FUJIFILM Corporation.

In view of better recognition property of the conductive portion, the surface roughness Ra of the rolls used in the calendar treatment is preferably 0 µm to 2.0 µm, and more preferably 0.3 µm to 1.0 µm.

The temperature applied at the time of the smoothing treatment typically performed with the calendar rolls is preferably 10° C. (unregulated) to 100° C. The temperature is more preferably within a range of about 10° C. (unregulated) to 50° C., although it varies with the scanning density or the shape of the pattern of the conductive portion or with the type of the binder.

(Step J (Heating Step))

The manufacturing method of the conductive sheet preferably further includes a step J of performing heating treatment on the support having the conductive portion after the step D. By performing the step J, the conductivity of the conductive portion is improved, and a conductive sheet having a better ion migration-inhibiting ability is obtained. Furthermore, by performing the step J, the haze of the conductive sheet is reduced, the adhesion of the conductive portion is improved, the surface quality at the time of oxidation treatment is improved, or the surface resistance is reduced.

As one of the examples of the method of the heating treatment, there is treatment of bringing the support having the conductive portion into contact with superheated vapor.

The superheated vapor may be superheated water vapor or a mixture of superheated water vapor and other gases.

The superheated vapor is preferably brought into contact with the conductive portion for a supply time within a range of equal to or longer than 10 seconds and equal to or less than 70 seconds. If the supply time is equal to or longer than 10 seconds, the conductivity is greatly improved. Moreover, because the conductivity is not improved any further from around 70 seconds, the supply time set to be longer than 70 seconds is not preferable in view of economies.

It is desirable that the superheated vapor be brought into contact with the conductive portion in a supply amount within a range of 500 g/m$^3$ to 600 g/m$^3$. Moreover, it is preferable that the temperature of the superheated vapor is controlled to be equal to or higher than 100° C. and equal to or less than 160° C. at 1 atm.

As another method of the heating treatment, for example, there is heating treatment performed at 80° C. to 150° C.

The heating time is not particularly limited. However, in view of making the aforementioned effect better, it is preferably 0.1 hours to 5.0 hours, and more preferably 0.5 hours to 1.0 hour.

(Step K (Stabilization Step))

The manufacturing method of the present invention preferably further includes, after the step D, a step K of bringing the support having the conductive portion into contact with a migration inhibitor. By performing the present step K, the metal silver in the conductive portion is stabilized, and thus ion migration is sufficiently inhibited even if the time taken for the gelatin removing treatment performed by the aforementioned protease is shortened.

As the migration inhibitor used, known materials can be used. For example, a nitrogen-containing heterocyclic compound or an organic mercapto compound is preferable, and among these, a nitrogen-containing heterocyclic compound is preferably used.

Preferable examples of the nitrogen-containing heterocyclic compound include 5- or 6-membered cyclic azoles, and among these, 5-membered azoles are preferable.

Examples of the heterocyclic ring include a tetrazole ring, a triazole ring, an imidazole ring, a thiadiazole ring, an oxadiazole ring, a selenadiazole ring, an oxazole ring, a thiazole ring, a benzoxazole ring, a benzothiazole ring, a benzimidazole ring, a pyrimidine ring, a triazaindene ring, a tetraazaindene ring, a pentaazaindene ring, and the like.

These rings may have a substituent, and examples of the substituent includes a nitro group, a halogen atom (for example, a chlorine atom or a bromine atom), a mercapto group, a cyano group, a substituted or unsubstituted alkyl group (for example, a group of methyl, ethyl, propyl, t-butyl, or cyanoethyl), an aryl group (for example, a group of phenyl, 4-methanesulfonamide phenyl, 4-methylphenyl, 3,4-dichlorophenyl, or naphthyl), an alkenyl group (for example, an allyl group), an aralkyl group (for example, a group of benzyl, 4-methylbenzyl, or phenethyl), a sulfonyl group (for example, a group of methanesulfonyl, ethanesulfonyl, or p-toluenesulfonyl), a carbamoyl group (for example, a group of unsubstituted carbamoyl, methyl carbamoyl, or phenyl carbamoyl), a sulfamoyl group (for example, a group of unsubstituted sulfamoyl, methyl sulfamoyl, or phenyl sulfamoyl), a carbonamide group (for example, a group of acetamide or benzamide), a sulfonamide group (for example, a group of methane sulfonamide, benzene sulfonamide, or p-toluene sulfonamide), an acyloxy group (for example, a group of acetyloxy or benzoyloxy), a sulfonyloxy group (for example, methane sulfonyloxy), a ureide group (for example, a group of unsubstituted ureide, methyl ureide, ethyl ureide, or phenyl ureide), an acyl group (for example, a group of acetyl or benzoyl), an oxycarbonyl group (for example, a group of methoxycarbonyl or phenoxycarbonyl), an oxycarbonylamino group (for example, a group of methoxycarbonylamino, phenoxycarbonylamino, or 2-ethylhexyloxycarbonylamino), a hydroxyl group, and the like. A single ring may be substituted with a plurality of substituents.

Preferable examples of the nitrogen-containing heterocyclic compound specifically include imidazole, benzimidazole, benzindazole, benzotriazole, benzoxazole, benzothiazole, pyridine, quinoline, pyrimidine, piperidine, piperazine, quinoxaline, morpholine, and the like. These may have a substituent such as an alkyl group, a carboxyl group, a sulfo group, or the like.

As the nitrogen-containing 6-membered cyclic compound, compounds having a triazine ring, a pyrimidine ring, a pyridine ring, a pyrroline ring, a piperidine ring, a pyridazine ring, or a pirazine ring are preferable. Among these, compounds having a triazine ring or a pyrimidine ring are preferable. These nitrogen-containing 6-membered cyclic compounds may have a substituent, and in this case, examples of the substituent include a lower alkyl group having 1 to 6 carbon atoms and more preferably having 1 to 3 carbon atoms, a lower alkoxy group having 1 to 6 carbon atoms and more preferably having 1 to 3 carbon atoms, a hydroxyl group, a carboxyl group, a mercapto group, an alkoxyalkyl group having 1 to 6 carbon atoms and more preferably having 1 to 3 carbon atoms, and a hydroxyalkyl group having 1 to 6 carbon atoms and more preferably having 1 to 3 carbon atoms.

Preferable examples of the nitrogen-containing 6-membered cyclic compound specifically include triazine, methyl triazine, dimethyl triazine, a hydroxyethyl triazine ring, pyrimidine, 4-methylpyrimidine, pyridine, and pyrroline.

Examples of the organic mercapto compound include an alkyl mercapto compound, an aryl mercapto compound, a heterocyclic mercapto compound, and the like.

Examples of the alkyl mercapto compound include cysteine, thiomalic acid, and the like. Examples of the aryl mercapto compound include thiosalicylic acid and the like. Examples of the heterocyclic mercapto compound include 2-phenyl-1-mercapto tetrazole, 2-mercaptobenzimidazole, 2-mercaptobenzothiazole, 2-mercaptobenzoxazole, 2-mercaptopyrimidine, 2,4-dimercaptopyrimidine, 2-mercaptopyridine, and the like. The aforementioned organic mercapto compounds may have a substituent such as an alkyl group, a carboxyl group, a sulfo group, or the like.

The method of bringing the support having the conductive portion into contact with the migration inhibitor is not particularly limited. Examples of the method include a method of coating the support with the migration inhibitor, a method of dipping the support having the conductive portions into the migration inhibitor, and the like.

If necessary, a solution obtained by dissolving the migration inhibitor in a solvent may be used. The type of the solvent used is not particularly limited, and examples of the solvent include the aforementioned solvents used in the composition for forming a photosensitive layer.

The contact time is not particularly limited, but it is preferably 0.5 minutes to 10 minutes, and more preferably 1.0 minute to 3.0 minutes.

(Step L (Organic Solvent Contact Step))

The manufacturing method of the present invention preferably further includes, after the step D, a step L of bringing the support having the conductive portion into contact with an organic solvent. By performing the present step L, the film of the polymer remaining in the conductive portion or in the non-conductive portion becomes denser. Consequentially, a conductive sheet having a better ion migration-inhibiting ability is obtained, and the value of haze of the conductive sheet can be reduced.

The type of the organic solvent used is not particularly limited, and depending on the type of the polymer, an optimal solvent is appropriately selected. Particularly, in view of making the aforementioned effect better, an organic solvent dissolving the polymer is preferable. Herein, "dissolving" means that 1 L of the organic solvent dissolves the polymer in an amount of at least equal to or greater than 5 g.

Particularly, an organic solvent having an SP value within a range of 8 to 12 is preferable.

Specific examples of the organic solvent include benzyl alcohol, ethanol, toluene, methyl ethyl ketone, acetone, ethyl acetate, and the like.

The method of bringing the support having the conductive portion into contact with the organic solvent is not particularly limited, and a known method can be adopted. Examples of the method include a method of coating the support with the organic solvent, a method of dipping the support having the conductive portion into the organic solvent, and the like.

The contact time of the organic solvent is not particularly limited. However, it is preferably 10 minutes to 60 minutes, and more preferably 15 minutes to 30 minutes.

(Step M (Polymer Crosslinking Step))

The manufacturing method of the conductive sheet of the present invention preferably has a step M of crosslinking the polymer different from gelatin, between the step B and the step D and/or after the step D. By performing the step M, it is possible to improve the adhesion between the conductive sheet and the optical adhesive layer and to prevent the conductive sheet from being easily peeled off.

The method for crosslinking the polymer contained in the conductive portion is not particularly limited, but it is preferable to use a crosslinking agent.

The type of the crosslinking agent used is not particularly limited, and according to the structure of the polymer used, an optimal crosslinking agent is appropriately selected. The type of the crosslinking agent is as described above.

The crosslinking method is not particularly limited, and examples thereof include a method of bringing the polymer into contact with the crosslinking agent. More specifically, examples of the crosslinking method include a method of coating the support having the conductive portion containing the polymer with a treatment solution containing the crosslinking agent, a method of dipping the support having the conductive portion containing the polymer into a treatment solution containing the crosslinking agent, and the like.

The contact time between the polymer and the crosslinking agent is not particularly limited, and according to the type of the crosslinking agent used or the like, optimal conditions are appropriately selected. Usually, the contact time is preferably 1 second to 300 seconds.

If necessary, after the polymer is brought into contact with the crosslinking agent, the conductive portion containing the polymer may be washed with water.

(Other Optional Steps)

After the step D, in order to improve the conductivity of the conductive portion, either or both of physical development and plating treatment for causing conductive metal particles to be supported on the conductive portion may be performed. In the present invention, one of the physical development and the plating treatment may be performed to cause the conductive metal particles to be supported on the conductive portion. Alternatively, the physical development and the plating treatment may be performed in combination so as to cause the conductive metal particles to be supported on the conductive portion.

In the present embodiment, "physical development" means a process of reducing a metal ion such as silver ion by using a reductant and thus depositing the metal particles on a nucleus of metal or a metal compound. The physical development is used for manufacturing an instant B&W film, an instant slide film, a printing plate, and the like, and the technique thereof can be used in the present invention.

In the present embodiment, the plating treatment can be performed by using electroless plating (chemical reduction plating or displacement plating). In the present embodiment, the electroless plating can be performed by using a known electroless plating technique. For example, an electroless plating technique used for a printed wiring board or the like can be used. The electroless plating is preferably electroless copper plating.

EXAMPLES

Hereinafter, the present invention will be more specifically described based on examples. The materials, the amount of the materials used, the ratio of the materials, the details of treatment, the procedure of treatment, and the like, that are shown in the following examples, can be appropriately changed within a range that does not depart from the gist of the present invention. Accordingly, the scope of the present invention is not limited to the following specific examples.

Example 1

(Preparation of Silver Halide Emulsion)

To the following Liquid 1 kept at 38° C. and pH 4.5, 90% each of the following Liquid 2 and Liquid 3 were simultaneously added over 20 minutes while being stirred, thereby forming 0.16 μm of nuclear particles. Subsequently, the following Liquid 4 and Liquid 5 were added thereto over 8 minutes, and then the remaining 10% each of the following Liquid 2 and Liquid 3 were added thereto over 2 minutes, such that the particles grew into 0.21 μm of particles. Thereafter, 0.15 g of potassium iodide was added thereto, the particles were allowed to mature for 5 minutes, and then the formation of particles was ended.

| Liquid 1: | |
|---|---|
| Water | 750 ml |
| Gelatin | 8.6 g |
| Sodium chloride | 3 g |
| 1,3-Dimethylimidazolidine-2-thione | 20 mg |
| Sodium benzene thiosulfonate | 10 mg |
| Citric acid | 0.7 g |

| Liquid 2: | |
|---|---|
| Water | 300 ml |
| Silver nitrate | 150 g |

| Liquid 3: | |
|---|---|
| Water | 300 ml |
| Sodium chloride | 38 g |
| Potassium bromide | 32 g |
| Potassium hexachloroiridate (III) (0.005% KCl 20% aqueous solution) | 5 ml |
| Ammonium hexachlororhodate (0.001% NaCl 20% aqueous solution) | 7 ml |

| Liquid 4: | |
|---|---|
| Water | 100 ml |
| Silver nitrate | 50 g |

| Liquid 5: | |
|---|---|
| Water | 100 ml |
| Sodium chloride | 13 g |
| Potassium bromide | 11 g |
| Potassium ferrocyanide | 5 mg |

Thereafter, according to a common method, the resultant was washed with water by a flocculation method. Specifically, the resultant was cooled to 35° C., and the pH thereof was reduced by using sulfuric acid until the silver halide was precipitated (the pH was within a range of 3.6±0.2). Next, about 3 L of supernatant liquid was removed (first washing with water). Subsequently, 3 L of distilled water was added thereto, and then sulfuric acid was added thereto until the silver halide was precipitated. Then 3 L of supernatant liquid was removed again (second washing with water). The same operation as the second washing with water was repeated once (third washing with water), and then the step of washing with water and demineralization was ended. The pH of the emulsion obtained after the washing with water and demineralization was adjusted to 6.4, and the pAg thereof was adjusted to 7.5. Next, by adding 2.5 g of gelatin, 10 mg of sodium benzene thiosulfonate, 3 mg of sodium benzene thiosulfinate, 15 mg of sodium thiosulfate, and 10 mg of chloroauric acid to the emulsion, chemical sensitization was performed on the emulsion such that the emulsion exhibited optimal sensitivity at 55° C. Thereafter, 100 mg of 1,3,3a,7-tetraazaindene as a stabilizer and 100 mg of Proxel (trade name, manufactured by ICI Co., Ltd.) as a preservative were added thereto. The finally obtained emulsion was an emulsion of cubic silver iodochlorobromide particles that contained 0.08 mol % of silver iodide and silver chlorobromide composed of silver chloride and silver bromide at a ratio of 70 mol % and 30 mol %, and had an average particle size of 0.22 μm and a coefficient of variation of 9%.

(Preparation of Composition for Forming Photosensitive Layer)

To the aforementioned emulsion, 1,3,3a,7-tetraazaindene in an amount of $1.2 \times 10^{-4}$ mol/mol Ag, hydroquinone in an amount of $1.2 \times 10^{-2}$ mol/mol Ag, citric acid in an amount of $3.0 \times 10^{-4}$ mol/mol Ag, and 2,4-dichloro-6-hydroxy-1,3,5-triazine sodium salt in an amount of 0.90 g/mol Ag and a trace amount of a film hardening agent were added. By using citric acid, the pH of the coating liquid was adjusted to be 5.6.

To the coating liquid, polymer latex containing the polymer represented by (P-1) exemplified above and a dispersant composed of dialkylphenyl PEO sulfuric acid ester (mass ratio of dispersant/polymer was 2.0/100=0.02) was added such that a mass ratio of the polymer to the gelatin contained in the coating liquid became 0.5/1 (a mass ratio of polymer/gelatin became 0.5/1).

Furthermore, as a crosslinking agent, EPDXY RESIN DY 022 (trade name, manufactured by Nagase ChemteX Corporation) was added thereto. The amount of the crosslinking agent added was adjusted such that the amount of the crosslinking agent in the silver halide-containing photosensitive layer, which will be described later, became 0.09 g/m².

In this way, a composition for forming a photosensitive layer was prepared.

The polymer represented by (P-1) exemplified above was synthesized with reference to JP 3305459 B and JP 3754745 B.

(Photosensitive Layer Forming Step)

A polyethylene terephthalate (PET) film having a thickness of 100 μm was coated with the aforementioned polymer latex, thereby forming an undercoat layer having a thickness of 0.05 μm on the PET film.

Thereafter, the undercoat layer was coated with a composition for forming a silver halide-free layer, which was obtained by mixing the polymer latex and gelatin together, thereby forming a silver halide-free layer having a thickness of 1.0 μm on the undercoat layer. The mixing ratio (polymer/gelatin) of the polymer to the gelatin was 2/1 in terms of mass, and the content of the polymer was 0.65 g/m².

Next, the silver halide-free layer was coated with the composition for forming a photosensitive layer to provide a silver halide-containing photosensitive layer having a thickness of 2.5 μm on the silver halide-free layer. The mixing mass ratio of the polymer to the gelatin (polymer/gelatin) in the silver halide-containing photosensitive layer was 0.5/1, and the content of the polymer was 0.22 g/m².

Then, the silver halide-containing photosensitive layer was coated with a composition for forming a protective layer that was obtained by mixing the polymer latex and the gelatin together, thereby forming a protective layer having a thickness of 0.15 μm on the silver halide-containing photosensitive layer. The mixing ratio (polymer/gelatin) of the polymer to the gelatin was 0.1/1 in terms of mass, and the content of the polymer was 0.015 g/m².

(Exposure and Development Step)

The photosensitive layer prepared as above was exposed to parallel light from a high-pressure mercury lamp as a light source, through photomask that can give a developed silver image having a test pattern shown in FIG. 5. The migration test pattern was a pattern based on IPC-TM650 or SM840. In this pattern, a line width was 50 μm, a space width was 50 μm, and a number of lines was 17/18 (hereinafter, the pattern will be referred to as a comb-like pattern electrode). Furthermore, a plurality of the photosensitive layers obtained as above was separately prepared, and in order to prepare other samples for evaluation, the respective photosensitive layers were exposed to parallel light from a high-pressure mercury lamp as a light source, through a lattice-like photomask giving a conductive pattern in which conductive portion/non-conductive portion was 5.0 μm/295 μm, 4.0 μm/296 μm, 3.0 μm/297 μm, 2.5 μm/297.5 μm, and 2.0 μm/298 μm (hereinafter, the sample will be referred to as a mesh pattern electrode as appropriate). After the exposure, the samples were developed with following developer and further subjected to development treatment by using a fixing solution (trade name: N3X-R for CN16X, manufactured by FUJIFILM Corporation). Thereafter, the samples were rinsed with pure water and dried, thereby obtaining a sample A having a comb-like pattern electrode, a sample B having a mesh pattern electrode of 5.0 μm/295 μm, a sample C having a mesh pattern electrode of 4.0 μm/296 μm, a sample D having a mesh pattern electrode of 3.0 μm/297 μm, a sample E having a mesh pattern electrode of 2.5 μm/297.5 μm, and a sample F having a mesh pattern electrode of 2.0 μm/298 μm. Furthermore, in order to determine the quantity of the gelatin between the thin conductive wires in a simple way, a sample not exposed to light was subjected to the development treatment in the same manner as described above, thereby obtaining a sample G which did not have the thin conductive wires and had only the non-conductive portion. In addition, in order to determine the quantity of the gelatin in the thin conductive wires in a simple way, a sample, which was exposed to parallel light from a high-pressure mercury lamp as a light source through a photomask for making the entire surface of the sample into a conductive portion, was subjected to the development treatment in the same manner as described above, thereby obtaining a sample H that had only the thin conductive wires and did not have the non-conductive portion.

Herein, between the thin conductive wires of the samples A to F, there was a binder portion containing the aforementioned polymer.

(Composition of Developer)

| 1 L of the developer contained the following compounds. | |
| --- | --- |
| Hydroquinone | 0.037 mol/L |
| N-methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

(Heating Treatment (1))

Each of the samples A to H obtained as above was subjected to heating treatment by being left to stand for 130 seconds in a superheated vapor tank at 120° C.

(Preparation of Gelatin Decomposition Solution)

Triethanolamine and sulfuric acid were added to an aqueous solution (concentration of protease: 0.5% by mass) of a protease (30 L of Bioprase manufactured by Nagase ChemteX Corporation), thereby adjusting the pH of the solution to be 8.5.

(Gelatin Decomposition Treatment)

Each of the samples A to H obtained as above was dipped for 120 seconds into the aqueous solution of the protease (40° C.) taken out of the aqueous solution, and washed by being dipped into hot water (temperature: 50° C.) for 120 seconds.

(Polymer Crosslinking Treatment)

Each of the samples A to H obtained as above was dipped for 30 seconds into a 1% aqueous solution of Carbodilite V-02-L2 (trade name, manufactured by Nisshinbo Chemical Inc.), taken out of the aqueous solution, and washed by being dipped into pure water (room temperature) for 60 seconds.

[Various Evaluations]

(Migration Evaluation (1))

The sample A having the comb-like pattern electrode prepared as above was left to standstill in a moist-heat environment at 85° C. and 85% RH, wirings were connected to both ends of the sample A, and a direct current of 5 V was continuously applied thereto from one end. After a certain period of time, the sample was taken out of the environment at 85° C. and 85% RH, and by using R8340A manufactured by ADVANTEST CORPORATION, a voltage of a direct current of 5 V was applied thereto. In this way, the insulation resistance of the sample was measured and evaluated according to the following criteria.

"A": The value of insulation resistance was equal to or greater than $10^{10}Ω$ for a time period equal to or longer than 500 hours.

"B": The value of insulation resistance was reduced to be less than $10^{10}Ω$ for a time period equal to or longer than 200 hours and less than 500 hours.

"C": The value of insulation resistance was reduced to be less than $10^{10}Ω$ for a time period equal to or longer than 50 hours and less than 200 hours.

"D": The value of insulation resistance was reduced to be less than $10^{10}Ω$ for a time period less than 50 hours.

(Migration Evaluation (2))

A transparent adhesive layer 1 (trade name: NSS50, manufactured by New Tac Kasei Co., Ltd., acid value: 34 mg KOH/g, water absorption rate: 0.91%) or a transparent adhesive layer 2 (trade name: 8146-2, manufactured by 3M Corporation, acid value: 56 mg KOH/g, water absorption rate: 0.47%) was pasted onto the surface, on which the thin conductive wires are disposed, of the sample A, thereby preparing samples. Thereafter, according to the same procedure as in (Migration evaluation (1)), the insulation resistance of each of the samples was measured. The evaluation criteria were the same as those in (Migration evaluation (1)).

(Evaluation of Value of Haze)

By using TC-HIII manufactured by NIPPON DENSHOKU INDUSTRIES Co., LTD, the value of haze of the sample C having a mesh pattern electrode was measured by the method based on JIS-K-7105. The value of haze was evaluated according to the following criteria.

"A": The value of haze was less than 7%.

"B": The value of haze was equal to or greater than 7% and less than 10%.

"C": The value of haze was equal to or greater than 10%.

(Evaluation of Adhesiveness)

By using the samples B and E having a mesh pattern electrode, the adhesiveness was evaluated by the cross-cut method based on JIS-K-5600. The adhesiveness was evaluated according to the following criteria. When peeling occurred in one of the samples, the sample was evaluated to be "B".

"A": Peeling did not occur.

"B": Peeling occurred.

(Evaluation of Surface Quality at the Time of Enzyme Treatment)

The sample F having a mesh pattern electrode was subjected to enzyme treatment. At this time, a sample in which peeling of a film did not occur was evaluated to be "A", and a sample in which peeling of a film occurred was evaluated to be "B".

(Evaluation of Value of Resistance) By using the sample D having a mesh pattern electrode, the values of resistance in 10 random sites were measured using a resistivity meter (Loresta manufactured by Mitsubishi Chemical Analytech Co., Ltd.: using 4 probes in series (ASP)). The average of the values was taken as a value of surface resistance. The value of surface resistance was evaluated according to the following criteria.

"A": The value of surface resistance was less than 50 Ω/sq.

"B": The value of surface resistance was equal to or greater than 50 Ω/sq and less than 100 Ω/sq.

"C": The value of surface resistance was equal to or greater than 100 Ω/sq.

(Measurement of Content of Gelatin Between Thin Conductive Wires)

The content of the gelatin between the thin conductive wires was evaluated by using the sample G as a model sample.

Specifically, the content of the gelatin was measured by using a BCA method (bicinchoninic acid method). First, in order to obtain mother liquors for a calibration curve, 10 g of gelatin was mixed with 115 g of deionized water, 5 g of gelatin was mixed with 120 g of deionized water, 5 g of gelatin was mixed with 245 g of deionized water, and 5 g of gelatin was mixed with 495 g of deionized water. The gelatin in each of the mother liquors was allowed to swell for 30 minutes and then dissolved for 30 minutes while being stirred at 40° C., thereby obtaining "gelatin solutions for a calibration curve". Each of the "gelatin solutions for a calibration curve" in an amount of 2.5 cc was put into a test tube. As a sample for determining the quantity of the gelatin, the sample G, which did not have the thin conductive wires and had only the non-conductive portion, was subjected to the gelatin decomposition treatment, then cut down to a size of 1 cm×1 cm, and put into the test tube. Subsequently, deionized water in an amount of 2.5 cc was put into the test tube.

A reagent A, a reagent B, and a reagent C of Micro BCA Protein Assay Kit Liquid manufactured by Thermo Fisher Scientific Inc., were mixed together at a volume ratio of 25:24:1, thereby preparing a quantitation reagent. The quantitation reagent in an amount of 2.5 cc was put into each of the test tubes, which respectively contained the "gelatin solution for a calibration curve" and the sample for determining the quantity of the gelatin, the test tubes were closed with a stopper, and the contents of the tubes were thoroughly stirred. By using a thermostatic oscillation tank, all of the samples were caused to perform color development for 1 hour at 60° C. under a condition of an oscillation speed of 160 times of reciprocation/min, and cooled to room temperature. After 10 minutes, by using U-3300 manufactured by Hitachi, Ltd., the absorbance at 562 nm of the samples was promptly measured. From the absorbance of the gelatin solutions for a calibration curve, the amount of the gelatin in the sample (sample G) for analysis was calculated. This amount of the gelatin corresponds to the amount of the gelatin between the thin conductive wires.

(Measurement of Content of Gelatin in Thin Conductive Wires)

The content of the gelatin in the thin conductive wires was evaluated by using the sample H as a model sample.

The content of the gelatin was measured by using the BCA method as the above. The BCA method is an assay method utilizing the property in which a protein reduces alkaline Cu (II) to Cu (I). Therefore, if there is silver, that exhibits reducing properties, in the sample, an accurate value cannot be obtained. For this reason, desilverization treatment was performed by using the following method, and then the content of the gelatin was measured by using the BCA method as the above. The sample H, which did not have the non-conductive portion and had only a silver wire portion, was subjected to gelatin decomposition treatment, and then FR-1 manufactured by FUJIFILM Corporation and deionized water were mixed together at a volume ratio of 1:2, thereby preparing a desilverization solution. The desilverization solution was kept at 25° C., and the sample H was dipped into the desilverization solution for 10 minutes while being stirred in a nitrogen atmosphere. Subsequently, the sample H was dipped into deionized water for 2 seconds, then thoroughly washed with water for 15 minutes, and dried at room temperature, thereby obtaining a desilverized sample.

(Measurement of Content of Metal Silver in Thin Conductive Wires)

The content of the metal silver in the thin conductive wires was measured by performing fluorescent X-ray analysis on the thin conductive wires in the sample H.

(Measurement of Peel Strength)

By using a transparent adhesive layer (trade name: 8146-2, manufactured by 3M Corporation), the sample D cut down to a size of 25 mm (width)×10 mm (length) was pasted to glass. The resultant was left as is for 30 minutes at 65° C. and then returned to room temperature. Thereafter, by using a vertical motorized stand MX2-500N manufactured by IMADA, Inc, a load was applied to the sample D in the vertical direction thereof, and by using a digital force gauge ZTA-50N manufactured by IMADA, Inc, the value of the load was measured.

Example 2

Samples were prepared and subjected to various evaluations according to the same procedure as in Example 1, except that (Heating treatment (1)) was additionally performed after (Gelatin decomposition treatment). The results are summarized in Table 1.

Example 3

Samples were prepared and subjected to various evaluations according to the same procedure as in Example 2, except that the mixing mass ratio (polymer/gelatin) of the polymer and gelatin in the silver halide-containing photosensitive layer was changed to 2/1 from 0.5/1. The results are summarized in Table 1.

Example 4

Samples were prepared and subjected to various evaluations according to the same procedure as in Example 2, except that the mixing mass ratio (polymer/gelatin) of the polymer and gelatin in the silver halide-free layer was changed to 3/1 from 2/1. The results are summarized in Table 1.

Example 5

Samples were prepared and subjected to various evaluations according to the same procedure as in Example 2, except that the following (Xenon treatment) was performed before (Heating treatment (1)). The results are summarized in Table 1.

(Xenon Treatment)

By using a xenon flash lamp manufactured by XENON Corporation as a xenon flash lamp, the samples were irradiated with pulsed light for 125 seconds. At this time, the input energy of the lamp (lamp power) per session of irradiation was set to be 926 J, the pulse width of the pulsed light (irradiation time of the pulsed light per session) was set to be 120 microseconds, and the irradiation interval was set to be 0.1 second.

Example 6

Samples were prepared and subjected to various evaluations according to the same procedure as in Example 2, except that the following (Calendar treatment (1)) was performed between (Gelatin decomposition treatment) and the second (Heating treatment (1)). The results are summarized in Table 1.

(Calendar Treatment (1))

By using mirror-finished metal rolls, calendar treatment was performed on the samples by passing the samples between rollers by applying a pressure of 5 MPa.

Example 7

Samples were prepared and subjected to various evaluations according to the same procedure as in Example 2, except that (Heating treatment (2)) was performed instead of (Heating treatment (1)). The results are summarized in Table 1.

(Heating Treatment (2))

The samples were left to stand for 2 hours in an environment at 120° C.

Example 8

Samples were prepared and subjected to various evaluations according to the same procedure as in Example 2, except that the following (Calendar treatment (2)) was performed between (Gelatin decomposition treatment) and (Heating treatment (1)). The results are summarized in Table 1.

(Calendar Treatment (2))

By using plastic rolls, calendar treatment was performed on the samples by passing the samples between rollers by applying a pressure of 5 MPa. The surface roughness Ra of the plastic rolls used was 0.6 μm.

Example 9

Samples were prepared and subjected to various evaluations according to the same procedure as in Example 8, except that the length of time for which the samples were dipped into the aqueous solution of the protease was changed to 60 seconds from 120 seconds. The results are summarized in Table 1.

Example 10

Samples were prepared and subjected to various evaluations according to the same procedure as in Example 8, except that the length of time for which the samples were dipped into the aqueous solution of the protease was changed to 30 seconds from 120 seconds. The results are summarized in Table 1.

Example 11

Samples were prepared and subjected to various evaluations according to the same procedure as in Example 8, except that the length of time for which the samples were dipped into the aqueous solution of the protease was changed to 360 seconds from 120 seconds. The results are summarized in Table 1.

Example 12

Samples were prepared and subjected to various evaluations according to the same procedure as in Example 8, except that the length of time for which the samples were dipped into the hot water (temperature: 50° C.) was changed to 60 seconds from 120 seconds. The results are summarized in Table 1.

Example 13

Samples were prepared and subjected to various evaluations according to the same procedure as in Example 8, except that the length of time for which the samples were dipped into the hot water (temperature: 50° C.) was changed to 30 seconds from 120 seconds. The results are summarized in Table 1.

Example 14

Samples were prepared and subjected to various evaluations according to the same procedure as in Example 8, except that the length of time for which the samples were dipped into the aqueous solution of the protease was changed to 360 seconds from 120 seconds, and the length of time for which the samples were dipped into the hot water (temperature: 50° C.) was changed to 360 seconds from 120 seconds. The results are summarized in Table 1.

Example 15

Samples were prepared and subjected to various evaluations according to the same procedure as in Example 8, except that (Polymer crosslinking treatment) was not performed. The results are summarized in Table 1.

Comparative Example 1

Samples were prepared and subjected to various evaluations according to the same procedure as in Example 2, except that the temperature of the hot water was changed to 70° C. from 50° C., and the length of time for which the samples were dipped into the hot water (temperature: 70° C.) was changed to 10 seconds from 120 seconds. The results are summarized in Table 1.

Comparative Example 2

Samples were prepared and subjected to various evaluations according to the same procedure as in Example 2, except that the length of time for which the samples were dipped into the aqueous solution of the protease was changed to 30 seconds from 120 seconds, the temperature of the hot water was changed to 70° C. from 50° C., and the length of time for which the samples were dipped into the hot water (temperature: 70° C.) was changed to 10 seconds from 120 seconds. The results are summarized in Table 1.

Comparative Example 3

Samples were prepared and subjected to various evaluations according to the same procedure as in Example 1, except that (Heating treatment (1)) and (Gelatin decomposition treatment) were not performed. The results are summarized in Table 1.

In Table 1, "MG evaluation (without transparent adhesive layer)" shows the evaluation results obtained by (Migration evaluation (1); "MG evaluation (transparent adhesive layer: NSS)" shows the evaluation results obtained by using NSS50 described in (Migration evaluation (2)); and "MG evaluation (transparent adhesive layer: 3M)" shows the evaluation results obtained by using 8146-2 described in (Migration evaluation (2)).

Furthermore, in Table 1, "Content of gelatin in opening portion" means the content of the gelatin between the thin conductive wires, and "<0.02 (g/m$^2$)" means that the content of the gelatin is less than 0.02 (g/m$^2$).

In addition, as described above, the polymer represented by (P-1) is between the thin conductive wires, and accordingly, in Table 1, "Content of polymer in opening portion" means the content (g/m$^2$) of the polymer between the thin conductive wires.

TABLE 1

| | Silver halide-free layer | | Silver halide-containing photosensitive layer | | Protease treatment step | | | |
|---|---|---|---|---|---|---|---|---|
| | Content of polymer (g/m$^2$) | Polymer/gelatin (mass ratio) | Content of polymer (g/m$^2$) | Polymer/gelatin (mass ratio) | Protease treatment temperature (° C.) | Protease treatment time (sec) | Temperature of washing with hot water (° C.) | Time of washing with hot water (sec) |
| Example 1 | 0.65 | 2/1 | 0.22 | 0.5/1 | 40 | 120 | 50 | 120 |
| Example 2 | 0.65 | 2/1 | 0.22 | 0.5/1 | 40 | 120 | 50 | 120 |
| Example 3 | 0.65 | 2/1 | 0.88 | 2/1 | 40 | 120 | 50 | 120 |
| Example 4 | 0.975 | 3/1 | 0.22 | 0.5/1 | 40 | 120 | 50 | 120 |
| Example 5 | 0.65 | 2/1 | 0.22 | 0.5/1 | 40 | 120 | 50 | 120 |
| Example 6 | 0.65 | 2/1 | 0.22 | 0.5/1 | 40 | 120 | 50 | 120 |
| Example 7 | 0.65 | 2/1 | 0.22 | 0.5/1 | 40 | 120 | 50 | 120 |
| Example 8 | 0.65 | 2/1 | 0.22 | 0.5/1 | 40 | 120 | 50 | 120 |
| Example 9 | 0.65 | 2/1 | 0.22 | 0.5/1 | 40 | 60 | 50 | 120 |
| Example 10 | 0.65 | 2/1 | 0.22 | 0.5/1 | 40 | 30 | 50 | 120 |
| Example 11 | 0.65 | 2/1 | 0.22 | 0.5/1 | 40 | 360 | 50 | 120 |
| Example 12 | 0.65 | 2/1 | 0.22 | 0.5/1 | 40 | 120 | 50 | 60 |
| Example 13 | 0.65 | 2/1 | 0.22 | 0.5/1 | 40 | 120 | 50 | 30 |
| Example 14 | 0.65 | 2/1 | 0.22 | 0.5/1 | 40 | 360 | 50 | 360 |
| Example 15 | 0.65 | 2/1 | 0.22 | 0.5/1 | 40 | 120 | 50 | 120 |
| Comparative example 1 | 0.65 | 2/1 | 0.22 | 0.5/1 | 40 | 120 | 70 | 10 |
| Comparative example 2 | 0.65 | 2/1 | 0.22 | 0.5/1 | 40 | 30 | 70 | 10 |
| Comparative example 3 | 0.65 | 2/1 | 0.22 | 0.5/1 | Not performed | | | |

| | Light irradiation step | Smoothing step | | Heating step | | Polymer crosslinking step |
|---|---|---|---|---|---|---|
| | | Performed/not performed | Surface roughness of roll Ra(μm) | Before enzyme treatment | After enzyme treatment | |
| Example 1 | Not performed | Not performed | — | Superheated vapor | Not performed | Performed |
| Example 2 | Not performed | Not performed | — | Superheated vapor | Superheated vapor | Performed |
| Example 3 | Not performed | Not performed | — | Superheated vapor | Superheated vapor | Performed |
| Example 4 | Not performed | Not performed | — | Superheated vapor | Superheated vapor | Performed |
| Example 5 | Performed | Not performed | — | Superheated vapor | Superheated vapor | Performed |
| Example 6 | Not performed | Performed | Mirror surface | Superheated vapor | Superheated vapor | Performed |
| Example 7 | Not performed | Not performed | — | 120° C. | 120° C. | Performed |
| Example 8 | Not performed | Performed | 0.6 | Superheated vapor | Superheated vapor | Performed |
| Example 9 | Not performed | Performed | 0.6 | Superheated vapor | Superheated vapor | Performed |
| Example 10 | Not performed | Performed | 0.6 | Superheated vapor | Superheated vapor | Performed |
| Example 11 | Not performed | Performed | 0.6 | Superheated vapor | Superheated vapor | Performed |
| Example 12 | Not performed | Performed | 0.6 | Superheated vapor | Superheated vapor | Performed |
| Example 13 | Not performed | Performed | 0.6 | Superheated vapor | Superheated vapor | Performed |
| Example 14 | Not performed | Performed | 0.6 | Superheated vapor | Superheated vapor | Performed |
| Example 15 | Not performed | Performed | 0.6 | Superheated vapor | Superheated vapor | Not performed |

TABLE 1-continued

| | | | | | | |
|---|---|---|---|---|---|---|
| Comparative example 1 | Not performed | Not performed | — | Superheated vapor | Superheated vapor | Not performed |
| Comparative example 2 | Not performed | Not performed | — | Not performed | Not performed | Not performed |
| Comparative example 3 | Not performed | Not performed | — | Not performed | Not performed | Not performed |

| | Various evaluations | | | | | |
|---|---|---|---|---|---|---|
| | Silver wire portion A/B | Content of gelatin in silver wire portion (g/m$^2$) | Content of gelatin in opening portion (g/m$^2$) | Content of polymer in opening portion (g/m$^2$) | MG evaluation (without transparent adhesive layer) | MG evaluation (transparent adhesive layer; NSS) |
| Example 1 | 0.919 | 0.366 | <0.02 | 0.885 | A | A |
| Example 2 | 0.919 | 0.366 | <0.02 | 0.885 | A | A |
| Example 3 | 0.863 | 0.390 | <0.02 | 1.545 | A | A |
| Example 4 | 0.748 | 0.450 | <0.02 | 1.21 | A | A |
| Example 5 | 0.909 | 0.370 | <0.02 | 0.885 | A | A |
| Example 6 | 0.919 | 0.366 | <0.02 | 0.885 | A | A |
| Example 7 | 2.243 | 0.150 | <0.02 | 0.885 | A | B |
| Example 8 | 0.919 | 0.366 | <0.02 | 0.885 | A | A |
| Example 9 | 0.529 | 0.636 | <0.02 | 0.885 | A | A |
| Example 10 | 0.467 | 0.720 | <0.02 | 0.885 | A | A |
| Example 11 | 2.781 | 0.121 | <0.02 | 0.885 | A | B |
| Example 12 | 1.107 | 0.304 | <0.02 | 0.885 | A | A |
| Example 13 | 0.919 | 0.366 | <0.02 | 0.885 | A | A |
| Example 14 | 4.948 | 0.068 | <0.02 | 0.885 | A | B |
| Example 15 | 0.919 | 0.366 | <0.02 | 0.885 | A | A |
| Comparative example 1 | 0.691 | 0.487 | 0.186 | 0.885 | D | D |
| Comparative example 2 | 0.807 | 0.417 | 0.375 | 0.885 | D | D |
| Comparative example 3 | 0.368 | 0.915 | 0.915 | 0.885 | D | D |

| | Various evaluations | | | | | |
|---|---|---|---|---|---|---|
| | MG evaluation (transparent adhesive layer; 3M) | Haze evaluation | Adhesion evaluation | Evaluation of surface quality at the time of enzyme treatment | Resistance value evaluation | Peel strength (N/mm) |
| Example 1 | A | B | B | A | B | — |
| Example 2 | A | A | A | A | A | 0.97 |
| Example 3 | A | C | A | A | C | 1.09 |
| Example 4 | A | C | A | A | A | 1.05 |
| Example 5 | A | A | A | A | A | 0.96 |
| Example 6 | A | A | A | A | A | 0.95 |
| Example 7 | B | B | A | A | A | 1.23 |
| Example 8 | A | A | A | A | A | 0.97 |
| Example 9 | A | A | A | A | A | 0.95 |
| Example 10 | A | A | A | A | A | 0.94 |
| Example 11 | B | A | A | A | A | 0.98 |
| Example 12 | A | A | A | A | A | 0.97 |
| Example 13 | A | A | A | A | A | 0.97 |
| Example 14 | B | A | A | A | A | 1.01 |
| Example 15 | A | A | A | A | A | 0.65 |
| Comparative example 1 | D | A | A | A | C | 0.75 |
| Comparative example 2 | D | C | A | — | C | 0.63 |
| Comparative example 3 | D | C | A | — | C | 0.63 |

As is evident from Table 1, it was confirmed that ion migration does not easily occur in the conductive sheet of the present invention.

From the comparison of Examples 1 to 15 (particularly, the comparison between Examples 7, 11, as well as 14 and other examples), it was confirmed that when the volume ratio (A/B) of the volume A of the metal silver to the volume B of the gelatin in the thin conductive wires is equal to or less than 2.0, the ion migration-inhibiting ability is further improved.

Examples 1 to 15 were excellent in all of the haze evaluation, the adhesion evaluation, the surface quality evaluation, and the resistance value evaluation, in addition to the ion migration.

From the comparison between Example 15 and other examples, it was confirmed that the peel strength is further improved when the polymer crosslinking step is performed.

In contrast, Comparative examples 1 to 3, in which the gelatin was contained between the thin conductive wires, were poor in the ion migration-inhibiting ability.

Herein, by changing the shape of the photomask used in (Exposure and development treatment), a detection electrode of a touch panel that was composed of thin conductive wires was prepared, and the transparent adhesive layer 1 (trade name: NSS50, manufactured by New Tac Kasei Co., Ltd., acid value: 34 mg KOH/g, water absorption rate: 0.91%) or the transparent adhesive layer 2 (trade name: 8146-2, manufactured by 3M Corporation, acid value: 56 mg KOH/g, water absorption rate: 0.47%) was pasted onto the thin conductive wires, thereby preparing a laminate. By using the laminate, a touch panel was manufactured.

What is claimed is:

1. A conductive sheet comprising:
 a support; and
 a conductive portion which is disposed on the support and composed of thin conductive wires containing metal silver and gelatin, wherein gelatin is substantially not contained between the thin conductive wires on the support, and a volume ratio (A/B) of a volume A of the metal silver to a volume B of the gelatin in the thin conductive wires is 0.3 to 10.0.

2. The conductive sheet according to claim 1, wherein the conductive sheet has a binder portion, which contains a polymer different from gelatin and substantially does not contain gelatin, between the thin conductive wires on the support.

3. The conductive sheet according to claim 2, wherein the volume ratio (A/B) is 0.3 to 2.0.

4. The conductive sheet according to claim 1, wherein the volume ratio (A/B) is 0.3 to 2.0.

5. A touch panel comprising:
the conductive sheet according to claim 1; and
a transparent adhesive layer disposed on the conductive portion of the conductive sheet,
wherein an acid value of an adhesive contained in the transparent adhesive layer is equal to or less than 100 mg KOH/g, and
a water absorption rate of the adhesive is equal to or less than 1.0%.

6. A manufacturing method of a conductive sheet comprising:
a support;
and a conductive portion which is disposed on the support and composed of thin conductive wires containing metal silver and gelatin,
wherein gelatin is substantially not contained between the thin conductive wires on the support, and
a volume ratio (A/B) of a volume A of the metal silver to a volume B of the gelatin in the thin conductive wires is 0.3 to 10.0;
the method comprising:
a step A of forming a silver halide-containing photosensitive layer, which contains silver halide, gelatin, and a polymer different from gelatin and in which a mass ratio (Y/X) of a mass Y of the polymer to a mass X of the gelatin is equal to or greater than 0.1, on a support;
a step B of forming a conductive portion composed of thin conductive wires, which contain metal silver and gelatin, by performing exposure and then development treatment on the silver halide-containing photosensitive layer;
a step C of performing heating treatment on the support having the conductive portion obtained by the step B; and
a step D of treating the support having the conductive portion with a protease which decomposes the gelatin.

7. The manufacturing method according to claim 6, wherein the support has an undercoat layer, which contains the polymer different from gelatin, on the surface of the support.

8. The manufacturing method according to claim 7, further comprising:
a step of forming a gelatin-containing protective layer on the silver halide-containing photosensitive layer between the step A and the step B.

9. The manufacturing method according to claim 7, further comprising:
a step of performing smoothing treatment on the conductive portion between the step B and the step D and/or after the step D.

10. The manufacturing method according to claim 7, further comprising:
a step of crosslinking the polymer different from gelatin between the step B and the step D and/or after the step D.

11. The manufacturing method according to claim 6, further comprising:
a step of forming a gelatin-containing protective layer on the silver halide-containing photosensitive layer between the step A and the step B.

12. The manufacturing method according to claim 11, further comprising:
a step of performing smoothing treatment on the conductive portion between the step B and the step D and/or after the step D.

13. The manufacturing method according to claim 11, further comprising:
a step of crosslinking the polymer different from gelatin between the step B and the step D and/or after the step D.

14. The manufacturing method according to claim 6, further comprising:
a step of performing smoothing treatment on the conductive portion between the step B and the step D and/or after the step D.

15. The manufacturing method according to claim 14, wherein the smoothing treatment is calendar treatment in which the support having the conductive portion is passed between one or more pairs of rolls under a pressure condition of 2 MPa to 120 MPa.

16. The manufacturing method according to claim 6, further comprising:
a step of crosslinking the polymer different from gelatin between the step B and the step D and/or after the step D.

17. The manufacturing method according to claim 6, further comprising:
a step of irradiating the conductive portion with pulsed light from a xenon flash lamp between the step B and the step D and/or after the step D.

18. The manufacturing method according to claim 17, wherein irradiation of the pulsed light from the xenon flash lamp is performed under conditions in which an irradiation energy per pulse is equal to or less than 1,500 J, and a number of times the pulsed light is radiated is equal to or less than 2,000.

19. A manufacturing method of a conductive sheet comprising:
a support;
and a conductive portion which is disposed on the support and composed of thin conductive wires containing metal silver and gelatin,
wherein gelatin is substantially not contained between the thin conductive wires on the support, and
a volume ratio (A/B) of a volume A of the metal silver to a volume B of the gelatin in the thin conductive wires is 0.3 to 10.0,
wherein the conductive sheet has a binder portion, which contains a polymer different from gelatin and substantially does not contain gelatin, between the thin conductive wires on the support;
the method comprising:
a step A of forming a silver halide-containing photosensitive layer, which contains silver halide, gelatin, and a polymer different from gelatin and in which a mass ratio (Y/X) of a mass Y of the polymer to a mass X of the gelatin is equal to or greater than 0.1, on a support;
a step B of forming a conductive portion composed of thin conductive wires, which contain metal silver and gelatin, by performing exposure and then development treatment on the silver halide-containing photosensitive layer;
a step C of performing heating treatment on the support having the conductive portion obtained by the step B; and
a step D of treating the support having the conductive portion with a protease which decomposes the gelatin.

* * * * *